(12) United States Patent
Ioki

(10) Patent No.: US 11,282,554 B2
(45) Date of Patent: Mar. 22, 2022

(54) DATA STORAGE CIRCUIT AND ELECTRONIC APPARATUS

(71) Applicant: ROHM Co., LTD., Kyoto (JP)

(72) Inventor: Kazuya Ioki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/064,884

(22) Filed: Oct. 7, 2020

(65) Prior Publication Data

US 2021/0104268 A1 Apr. 8, 2021

(30) Foreign Application Priority Data

Oct. 7, 2019 (JP) .............................. JP2019-184276

(51) Int. Cl.
*G11C 7/22* (2006.01)
*G11C 7/10* (2006.01)

(52) U.S. Cl.
CPC .............. *G11C 7/222* (2013.01); *G11C 7/106* (2013.01); *G11C 7/1072* (2013.01); *G11C 7/1087* (2013.01)

(58) Field of Classification Search
CPC ....... G11C 7/222; G11C 7/106; G11C 7/1072; G11C 7/1087

USPC ...................................................... 365/233.1
See application file for complete search history.

(56) References Cited

U.S. PATENT DOCUMENTS

2010/0039135 A1\* 2/2010 Miyazaki ............. H03K 3/0375
326/9

FOREIGN PATENT DOCUMENTS

JP 2010045610 2/2010

\* cited by examiner

*Primary Examiner* — Xiaochun L Chen
(74) *Attorney, Agent, or Firm* — Chip Law Group

(57) ABSTRACT

Disclosed is a data storage circuit that stores target input data inputted to a data input terminal and outputs the stored data as target output data through a data output terminal. The data storage circuit includes a clock control circuit that outputs a master clock signal and a slave clock signal based on a reference clock signal, a master latch circuit that takes the target input data based on the master clock signal, holds the taken data, and outputs the taken data as master output data, a slave latch circuit that takes the master output data based on the slave clock signal, holds the taken data, and outputs the taken data as slave output data, and an output data generation circuit that generates the target output data.

17 Claims, 14 Drawing Sheets

DATA TRANSMISSION STATE
OF MASTER LATCH CIRCUIT

DATA HOLDING STATE OF
MASTER LATCH CIRCUIT

DATA TRANSMISSION STATE
OF SLAVE LATCH CIRCUIT

DATA HOLDING STATE OF
SLAVE LATCH CIRCUIT

F I G . 8
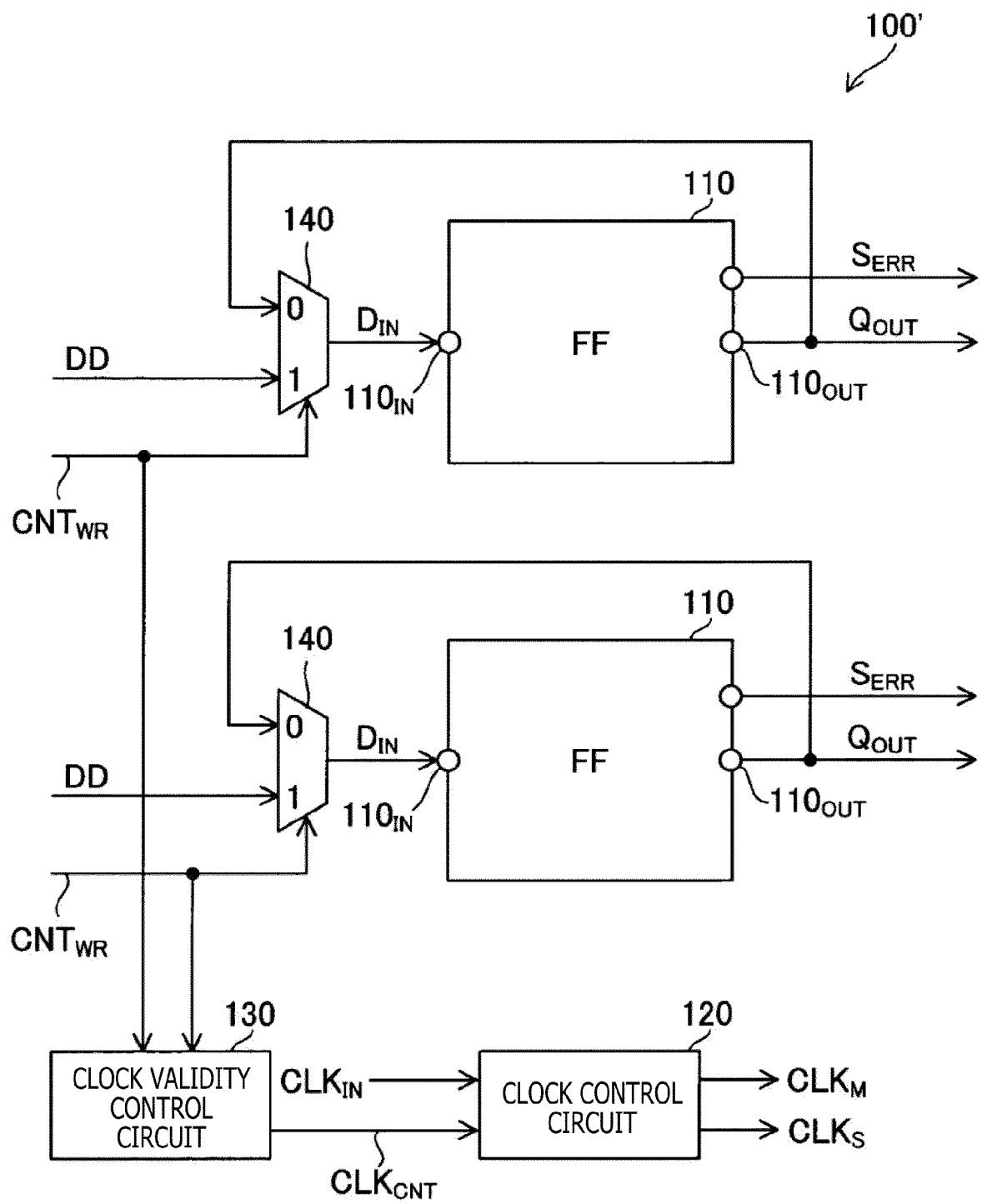

OVERLAP PERIOD OF TIME

NON-OVERLAP PERIOD OF TIME

NON-OVERLAP PERIOD OF TIME

DATA STORAGE CIRCUIT AND ELECTRONIC APPARATUS

CROSS REFERENCE TO RELATED APPLICATIONS

This application claims priority benefit of Japanese Patent Application No. JP 2019-184276 filed in the Japan Patent Office on Oct. 7, 2019. Each of the above-referenced applications is hereby incorporated herein by reference in its entirety.

BACKGROUND

The present disclosure relates to a data storage circuit and an electronic apparatus.

In semiconductor integrated circuits, soft errors which are caused by radioactive rays such as alpha rays or neutron rays become problems. Particularly in memories such as a dynamic random access memory (DRAM) or a static random access memory (SRAM), soft errors have been regarded as problems. However, with the progress in miniaturization of semiconductors, soft errors in flip flop circuits also cannot be ignored. Particularly for backbone systems, on-vehicle use, aircraft use, etc. which require high reliability, some countermeasures need to be taken for flip flop circuits.

An example of the related art is disclosed in Japanese Patent Laid-Open No. 2010-45610.

SUMMARY

One of countermeasures against a soft error in a flip flop circuit is adding an error correcting function or an error detecting function.

In a case where an error correcting function is added, even when a soft error occurs in a flip flop circuit, the soft error is corrected to exert no influence on output data. It will be useful to be able to correct the soft error with small overhead.

In a case where an error detecting function is added, occurrence of a soft error can literally be detected. If, for example, an error detection signal is outputted to a higher rank system when the soft error is detected, countermeasures of resetting a device, for example, can be taken therefor. It will be useful to be able to detect the soft error with small overhead.

It is desirable to provide a data storage circuit capable of correcting or detecting a soft error with small overhead, and an electronic apparatus using the data storage circuit.

A data storage circuit according to an embodiment of the present disclosure stores target input data inputted to a data input terminal and outputs the stored data as target output data through a data output terminal. The data storage circuit has a configuration (first configuration) including:
  a clock control circuit that outputs a master clock signal and a slave clock signal based on a reference clock signal;
  a master latch circuit that takes the target input data based on the master clock signal, holds the taken data, and outputs the taken data as master output data;
  a slave latch circuit that takes the master output data based on the slave clock signal, holds the taken data, and outputs the taken data as slave output data; and
  an output data generation circuit that generates the target output data, in which
  a plurality of the slave latch circuits are provided,
  after write target data inputted as the target input data to the data input terminal is taken by the master latch circuit and the plurality of slave latch circuits, the clock control circuit is shifted to a clock stop state of fixing a signal level of the master clock signal and a signal level of the slave clock signal such that all of the master latch circuit and the plurality of slave latch circuits are in a data holding state, and,
  during the clock stop state, the output data generation circuit generates the target output data, by majority decision, based on the master output data from the master latch circuit and a plurality of sets of slave output data from the plurality of slave latch circuits.

The data storage circuit according to the first configuration may have a configuration (second configuration), further including:
  a selector that selectively supplies, according to an inputted writing control signal, either the write target data or the target output data as the target input data to the data input terminal.

The data storage circuit according to the second configuration may have a configuration (third configuration), in which,
  after the write target data is supplied to the data input terminal by the selector and the write target data is taken by the master latch circuit and the plurality of slave latch circuits, the selector is shifted to a feedback state of supplying the target output data to the data input terminal, and the clock control circuit is shifted to the clock stop state.

The data storage circuit according to the third configuration may have a configuration (fourth configuration), in which,
  when an error that any one of data values of the master output data and the sets of slave output data is different from other data values is detected after a shift to the feedback state and a shift to the clock stop state, the clock control circuit temporarily cancels the clock stop state so that data held in the master latch circuit and data held in the plurality of slave latch circuits are updated by use of the target output data supplied by the selector to the data input terminal, and then, the clock control circuit restores the clock stop state.

The data storage circuit according to the fourth configuration may have a configuration (fifth configuration), in which
  a plurality of blocks each including the master latch circuit, the plurality of slave latch circuits, the output data generation circuit, and the selector are provided, and one clock control circuit is shared by the plurality of blocks, and,
  when the error is detected in any one of the blocks after a shift to the feedback state and a shift to the clock stop state, the clock control circuit temporarily cancels the clock stop state so that, in each of the blocks, data held in the master latch circuit and data held in the plurality of slave latch circuits are updated by use of the target output data supplied by the selector to the data input terminal, and then, the clock control circuit restores the clock stop state.

The data storage circuit according to any one of the first to fourth configurations may have a configuration (sixth configuration), in which
  a plurality of blocks each including the master latch circuit, the plurality of slave latch circuits, and the output data generation circuit are provided, and one clock control circuit is shared by the plurality of blocks.

The data storage circuit according to the first configuration may have a configuration (seventh configuration), further including:
an update circuit that, when an error that any one of data values of the master output data and the sets of slave output data is different from other data values, updates data held in the master latch circuit and data held in the plurality of slave latch circuits by use of the target output data generated by majority decision.

Further, a data storage circuit according to another embodiment of the present disclosure stores target input data inputted to a data input terminal and outputs the stored data as target output data through a data output terminal. The data storage circuit has a configuration (eighth configuration) including:
a clock control circuit that outputs a master clock signal and a slave clock signal based on a reference clock signal;
a master latch circuit that takes the target input data based on the master clock signal, holds the taken data, and outputs the taken data as master output data;
a slave latch circuit that takes the master output data based on the slave clock signal, holds the taken data, and outputs the taken data as slave output data; and
an output data generation circuit that generates the target output data, in which
a plurality of the master latch circuits are provided, and the master output data from one of the plurality of master latch circuits is supplied to the slave latch circuit,
after write target data inputted as the target input data to the data input terminal is taken by the plurality of master latch circuits and the slave latch circuit, the clock control circuit is shifted to a clock stop state of fixing a signal level of the master clock signal and a signal level of the slave clock signal such that all of the plurality of master latch circuits and the slave latch circuit are in a data holding state, and,
during the clock stop state, the output data generation circuit generates the target output data, by majority decision, based on a plurality of sets of the master output data from the master latch circuits and the slave output data from the slave latch circuit.

The data storage circuit according to the eighth configuration may have a configuration (ninth configuration), further including:
a selector that selectively supplies, according to an inputted writing control signal, either the write target data or the target output data as the target input data to the data input terminal.

The data storage circuit according to the ninth configuration may have a configuration (tenth configuration), in which,
after the write target data is supplied by the selector to the data input terminal and the write target data is taken by the plurality of master latch circuits and the slave latch circuit, the selector is shifted to a feedback state of supplying the target output data to the data input terminal, and the clock control circuit is shifted to the clock stop state.

The data storage circuit according to the tenth configuration may have a configuration (eleventh configuration), in which
when an error that any one of data values of the sets of master output data and the slave output data is different from other data values is detected after a shift to the feedback state and a shift to the clock stop state, the clock control circuit temporarily cancels the clock stop state so that data held in the plurality of master latch circuits and data held in the slave latch circuit are updated by use of the target output data supplied by the selector to the data input terminal, and then, the clock control circuit restores the clock stop state.

The data storage circuit according to the eleventh configuration may have a configuration (twelfth configuration), in which
a plurality of bocks each including the plurality of master latch circuits, the slave latch circuit, the output data generation circuit, and the selector are provided, and one clock control circuit is shared by the plurality of blocks, and,
when the error is detected in any one of the blocks after a shift to the feedback state and a shift to the clock stop state, the clock control circuit temporarily cancels the clock stop state so that, in each of the blocks, data held in the plurality of master latch circuits and data held in the slave latch circuit are updated by use of the target output data supplied by the selector to the data input terminal, and then, the clock control circuit restores the clock stop state.

The data storage circuit according to any one of the eighth to eleventh configurations may have a configuration (thirteenth configuration), in which
a plurality of bocks each including the plurality of master latch circuits, the slave latch circuit, and the output data generation circuit are provided, and one clock control circuit is shared by the plurality of blocks.

The data storage circuit according to the eighth configuration may have a configuration (fourteenth configuration), further including:
an update circuit that, when an error that any one of data values of the sets of master output data and the slave output data is different from other data values, updates data held in the plurality of master latch circuits and data held in the slave latch circuit by use of the target output data generated by majority decision.

Further, a data storage circuit according to still another embodiment of the present disclosure stores target input data inputted to a data input terminal and outputs the stored data as target output data through a data output terminal. The data storage circuit has a configuration (fifteenth configuration) including:
a clock control circuit that outputs a master clock signal and a slave clock signal based on a reference clock signal;
a master latch circuit that takes the target input data based on the master clock signal, holds the taken data, and outputs the taken data as master output data;
a slave latch circuit that takes the master output data based on the slave clock signal, holds the taken data, and outputs the taken data as slave output data; and
an error detection circuit, in which
the slave output data is outputted as the target output data from the data output terminal,
after write target data inputted as the target input data to the data input terminal is taken by the master latch circuit and the slave latch circuit, the clock control circuit is shifted to a clock stop state of fixing a signal level of the master clock signal and a signal level of the slave clock signal such that both the master latch circuit and the slave latch circuit are in a data holding state, during the clock stop state, the error detection circuit outputs a prescribed error detection signal when a value of the master output data is not identical to a value of the slave output data, and the data storage circuit further includes a selector, and the selector selectively supplies, according to an inputted writing control signal, either the write target data or the target output data as the target input data to the data input terminal.

The data storage circuit according to the fifteenth configuration may have a configuration (sixteenth configuration), in which, after the write target data is supplied by the selector to the data input terminal and the write target data is taken by the master latch circuit and the slave latch circuit, the selector is shifted to a feedback state of supplying the target output data to the data input terminal, and the clock control circuit is shifted to the clock stop state.

The data storage circuit according to the fifteenth or sixteenth configuration may have a configuration (seventeenth configuration), in which a plurality of blocks each including the master latch circuit, the slave latch circuit, the error detection circuit, and the selector are provided, and one clock control circuit is shared by the plurality of blocks.

An electronic apparatus according to yet another embodiment of the present disclosure has a configuration (eighteenth configuration) including:

the data storage circuit according to any one of the first to seventeenth configurations; and a data using unit that operates by using the target output data from the data storage circuit, in which the data storage circuit has a section during which rewriting stored data is not required, and the clock control circuit is in the clock stop state during the section.

The present disclosure can provide a data storage circuit capable of correcting or detecting a soft error with small overhead, and an electronic apparatus using the data storage circuit.

BRIEF DESCRIPTION OF THE DRAWINGS

FIG. 8 is a configuration diagram of a data storage circuit according to example EX1_2 which belongs to the first embodiment of the present disclosure;

DETAILED DESCRIPTION OF THE PREFERRED EMBODIMENTS

Figure 1:
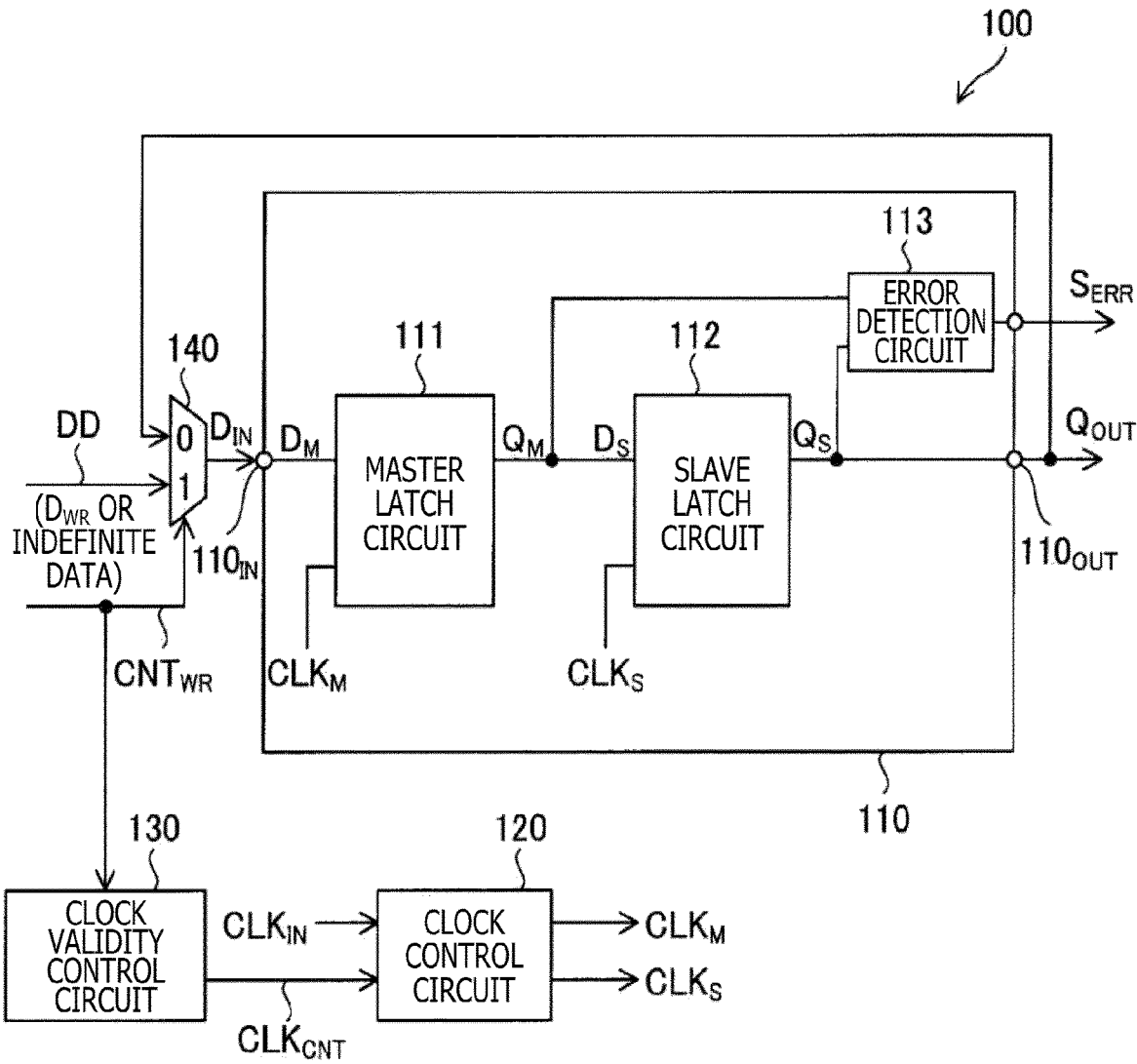
FIG. 1 is a configuration diagram of a data storage circuit according to a first embodiment of the present disclosure.

Hereinafter, embodiments of the present disclosure are specifically explained with reference to the drawings. The same components are denoted by the same reference symbols throughout the drawings, and an overlapping explanation of the same component is generally omitted. For simplification of the explanation, information, a signal, a physical quantity, an element, and a portion, etc. may be denoted by respective reference symbols or reference numerals to omit or abbreviate the names of the information, the signal, the physical quantity, the element, and the portion, etc. corresponding to the reference symbols or the reference numerals. For example, hereinafter, a master latch circuit (see FIG. 1) which is denoted by "111" may be written as master latch circuit 111 or may be abbreviated as latch circuit 111, but these expressions refer to the identical circuit.

First, an explanation is given of some terms that are used to describe the embodiments according to the present disclosure. A term "level" refers to a potential level. Regarding any signal or voltage, a high level has a higher potential than a low level. Regarding any signal or voltage, an expression that "the signal or voltage has a high level" means that the level of the signal or voltage is at a high level, and an expression that "the signal or voltage has a low level" means that the level of the signal or voltage is at a low level. The level of a signal may be expressed as a signal level. The level of a voltage may be expressed as a voltage level.

Regarding a certain optional attention signal, the inversion signal of the attention signal has a low level when the attention signal has a high level, and the inversion signal of the attention signal has a high level when the attention signal has a low level.

A transition from a low level to a high level of any signal or voltage is referred to as up-edge, and a timing of the transition from a low level to a high level is referred to as up-edge timing. Similarly, a transition from a high level to a low level of any signal or voltage is referred to as down-edge, and a timing of the transition from a high level to a low level is referred to as down-edge timing.

Regarding any signal having a high level or a low level as the signal level thereof, a section during which the level of the signal is at a high level is referred to as high-level section, and a section during which the level of the signal is at a low level is referred to as low-level section. The same applies to any voltage having a high level or a low level as the voltage level thereof.

First Embodiment

A first embodiment of the present disclosure is explained. FIG. 1 is a configuration diagram of a data storage circuit 100 according to the first embodiment. The data storage circuit 100 according to the first embodiment includes a flip flop circuit 110, a clock control circuit 120, a clock validity control circuit 130, and a selector 140. Hereinafter, a flip flop circuit may be abbreviated as "FF." The data storage circuit 100 is used mainly for eliminating the need for data rewriting after necessary data is once written into the FF 110.

The FF 110 includes a master latch circuit 111, a slave latch circuit 112, an error detection circuit 113, and a data input terminal $110_{IN}$ and a data output terminal $110_{OUT}$. Data which is inputted to the data input terminal $110_{IN}$ is referred to as input data $D_{IN}$. Data which is outputted from the data output terminal $110_{OUT}$ is referred to as output data $Q_{OUT}$. According to the function of the FF 110, the data storage circuit 100 in FIG. 1 can store the input data $D_{IN}$ (target input data) inputted to the data input terminal $110_{IN}$ and output the stored data as the output data $Q_{OUT}$ (target output data) through the data output terminal $110_{OUT}$.

A reference clock signal $CLK_{IN}$ is inputted to the clock control circuit 120. The clock control circuit 120 generates a master clock signal $CLK_M$ and a slave clock signal $CLK_S$ based on the reference clock signal $CLK_{IN}$ and supplies the master clock signal $CLK_M$ and the slave clock signal $CLK_S$ to the FF 110. Besides the reference clock signal $CLK_{IN}$, a clock validity control signal $CLK_{CNT}$ from the clock validity control circuit 130 is inputted to the clock control circuit 120. The signal $CLK_{CNT}$ is a binary signal having a value of "1" or "0." The clock control circuit 120 generates the clock signals $CLK_M$ and $CLK_S$ according to the value of the signal $CLK_{CNT}$.

Figure 2:
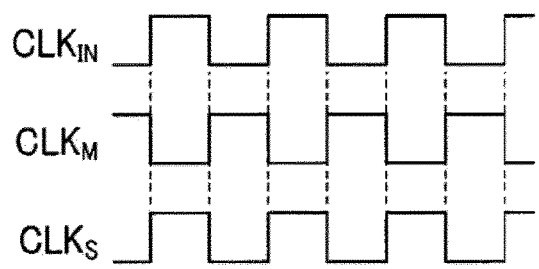
FIG. 2 is a diagram of a relation among a reference clock signal, a master clock signal, and a slave clock signal according to the first embodiment of the present disclosure.

FIG. 2 illustrates a relation among the clock signals $CLK_{IN}$, $CLK_M$, and $CLK_S$ in a state where the value of the signal $CLK_{CNT}$ is "1." Each of the clock signal $CLK_{IN}$, $CLK_M$, and $CLK_S$ is a binary signal having a low level or a high level. The reference clock signal $CLK_{IN}$ is a rectangular wave signal having a prescribed frequency and is generated at a clock generation circuit (not illustrated). It is assumed that, when the value of the signal $CLK_{CNT}$ is "1," the slave clock signal $CLK_S$ is set to be equal to the reference clock signal $CLK_{IN}$ while the master clock signal $CLK_M$ is set to be the inverse of the reference clock signal $CLK_{IN}$. Therefore, when the value of the signal $CLK_{CNT}$ is "1," the clock signals $CLK_{IN}$, $CLK_M$, and $CLK_S$ have the same frequency. However, a modification in which the relation among the clock signal $CLK_{IN}$ and the clock signals $CLK_M$ and $CLK_S$ is inverted, or a modification in which the frequency of the clock signals $CLK_M$ and $CLK_S$ is made different from the frequency of the clock signal $CLK_{IN}$, can be made.

When the value of the signal $CLK_{CNT}$ is switched from "1" to "0," a shift to a state (hereinafter, referred to as clock stop state) where the signal level of the clock signal $CLK_M$ and the signal level of the clock signal $CLK_S$ are each fixed at a low level is made. This transition will be explained later.

The clock validity control circuit 130 generates the clock validity control $CLK_{CNT}$ based on a writing control signal $CNT_{WR}$, and supplies the clock validity control $CLK_{CNT}$ to the clock control circuit 120.

The selector 140 includes a first input end, a second input end, and a control end. In the selector 140, the output data $Q_{OUT}$ from the data output terminal $110_{OUT}$ is inputted to the first input end, data DD is inputted to the second input end, and the writing control signal $CNT_{WR}$ from a writing control circuit (not illustrated) is inputted to the control end. To the second input end of the selector 140, write target data $D_{WR}$ from a data providing unit (not illustrated) may be inputted as the data DD or indefinite data having no significance value may be inputted as the data DD. The selector 140 selects either data inputted to the first input end or data inputted to the second input end according to the writing control signal $CNT_{WR}$ added to the control end, and outputs the selected data. The output data from the selector 140 is supplied as input data $D_{IN}$ to the data input terminal $110_{IN}$. The writing control signal $CNT_{WR}$ is a binary signal having a value of "1" or "0." It is assumed that, when the value of the writing control signal $CNT_{WR}$ is "0," the selector 140 enters a first selection state, and when the value is "1," the selector 140 enters a second selection state. During the first selection state of the selector 140, data (output data $Q_{OUT}$) inputted to the first input end is selected, and is inputted as the input data $D_{IN}$ to the data input terminal $110_{IN}$. During the second selection state of the selector 140, the data DD inputted to the second input end is selected and is inputted as the input data $D_{IN}$ to the data input terminal $110_{IN}$.

The input data $D_{IN}$ to the data input terminal $110_{IN}$ is inputted as master input data $D_M$ to the master latch circuit 111. The master latch circuit 111 takes the master input data $D_M$ (i.e., the input data $D_{IN}$) based on the master clock signal $CLK_M$ from the clock control circuit 120, holds the taken data, and outputs the taken data as master output data $Q_M$.

The master output data $Q_M$ from the master latch circuit 111 is inputted as slave input data $D_S$ to the slave latch circuit 112. The slave latch circuit 112 takes the slave input data $D_S$ (i.e., the master output data $Q_M$) based on the slave clock signal $CLK_S$ from the clock control circuit 120, holds the taken data, and outputs the taken data as slave output data $Q_S$. In the FF 110, the slave output data $Q_S$ from the slave latch circuit 112 is outputted as the output data $Q_{OUT}$ through the data output terminal $110_{OUT}$.

Each of signals indicating the data $D_{IN}$, $D_M$, $Q_M$, $D_S$, $Q_S$, and $Q_{OUT}$ is a 1-bit digital signal having a low level of a high level.

Figure 3:
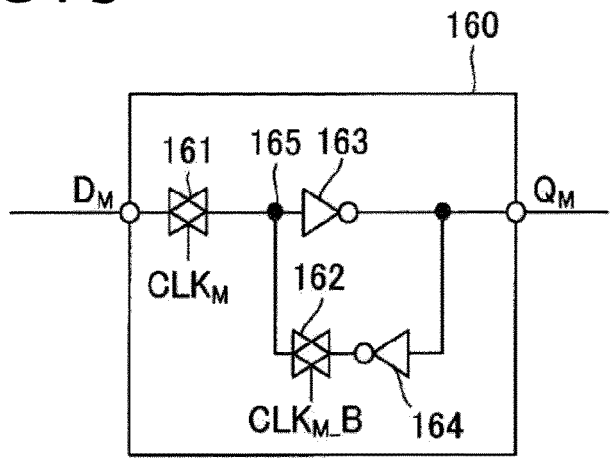
FIG. 3 is a diagram illustrating one configuration example of a master latch circuit according to the first embodiment of the present disclosure.

FIG. 3 illustrates a master latch circuit 160 as one example of a master latch circuit that can be used as the master latch circuit 111. The master latch circuit 160 includes switches 161 and 162 and inverter circuits 163 and 164. Any switches including the switches 161 and 162 and switches 171 and 172 (explained later) are analog switches serving as bidirectional switches. For example, these switches may be transmission gates each configured by using a field effect transistor of a complementary metal-oxide-semiconductor (CMOS). Any switches including the switches 161 and 162 and the switches 171 and 172 (explained later) each have a first end, a second end, and a control end, and the first end and the second end enter a conduction state or a non-conduction state (cut-off state) according to the level of a signal supplied to the control end. A state in which the first end and the second end are in the conduction state is referred to as ON state. A state in which the first end and the second end are in the non-conduction state (cut-off state) is referred to as OFF state. Here, it is assumed that, in each of any switches including the switches 161 and 162 and the switches 171 and 172 (explained later), the switch enters the ON state when the level of a signal to the control end is a high level, and the switch enters the OFF state when the level of a signal to the control end is a low level. The On state and the OFF state may be abbreviated as ON and OFF, respectively.

A signal indicating the master input data $D_M$ is inputted to the first end of the switch 161, and the second end of the switch 161 is connected to a node 165. The input end of the inverter circuit 163 is connected to the node 165. The inverter circuit 163 outputs, through the output end thereof, an inversion signal of a signal inputted to the input end thereof. The output signal of the inverter circuit 163 indicates the master output data $Q_M$. The output end of the inverter circuit 163 is connected to the input end of the inverter circuit 164. The inverter circuit 164 outputs, through the output end thereof, an inversion signal of a signal inputted to the input end thereof. Therefore, an inversion signal of the signal indicating the master output data $Q_M$ is outputted from the output end of the inverter circuit 164. The first end of the switch 162 is connected to the output end of the inverter circuit 164, and the second end of the switch 162 is connected to the node 165.

Figure 4A:
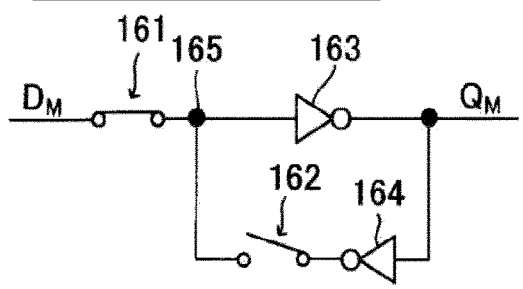
FIGS. 4A and 4B illustrate explanatory diagrams of a data transmission state and a data holding state of the master latch circuit according to the first embodiment of the present disclosure.
Figure 4B:
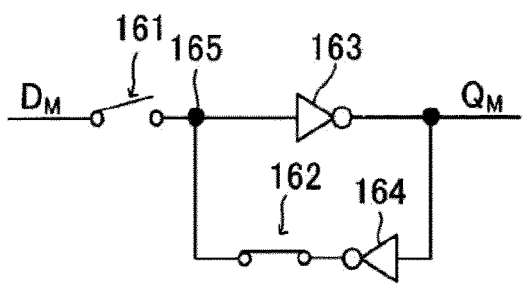

The master clock signal $CLK_M$ is inputted to the control end of the switch 161. An inversion signal $CLK_M\_B$ of the master clock signal $CLK_M$ is inputted to the control end of the switch 162. Accordingly, when the master clock signal $CLK_M$ is at a high level, the switch 161 is in the ON state while the switch 162 is in the OFF state so that the master latch circuit 160 is in a data transmission state. When the master clock signal $CLK_M$ is at a low level, the switch 161 is in the OFF state while the switch 162 is in the ON state so that the master latch circuit 160 is in a data holding state. FIGS. 4A and 4B schematically illustrate a data transmission state and a data holding state of the master latch circuit 160.

During the data transmission state of the master latch circuit 160, the current master input data $D_M$ is directly outputted as the master output data $Q_M$. It is to be noted that, during the data transmission state of the master latch circuit 160, the signal level indicating the data $D_M$ is the inverse of the signal level indicating the data $Q_M$, but the data $D_M$ is defined on the basis of a positive logic and the data $Q_M$ is defined on the basis of a negative logic, as described later. For this reason, during the data transmission state of the master latch circuit 160, the logical value of the data $D_M$ is identical to the logical value of the data $Q_M$. This condition is represented by the expression that "the current master input data $D_M$ is directly outputted as the master output data $Q_M$." During the data holding state of the master latch circuit 160, data held in the node 165 is outputted as the master output data $Q_M$ by means of the inverter circuit 164, independently of the current master input data $D_M$. That is, in the master latch circuit 160, the master input data $D_M$ is taken by the master latch circuit 160 in synchronization with an up-edge of the master clock signal $CLK_M$, and the taken data is latched (held) by the master latch circuit 160 in synchronization with a down-edge of the master clock signal $CLK_M$. When the master clock signal $CLK_M$ is fixed to a low level after the up-edge and the down-edge of the master clock signal $CLK_M$, the data holding state in which the data taken by the master latch circuit 160 is held by the master latch circuit 160 is continued.

Figure 5:
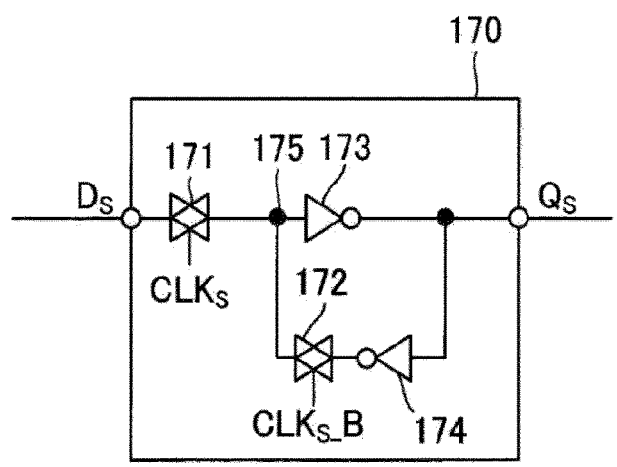
FIG. 5 is a diagram illustrating one configuration example of a slave latch circuit according to the first embodiment of the present disclosure.

FIG. 5 illustrates a slave latch circuit 170 as one example of a slave latch circuit that can be used as the slave latch circuit 112. The slave latch circuit 170 includes switches 171 and 172 and inverter circuits 173 and 174.

A signal indicating the slave input data $D_S$ is inputted to the first end of the switch 171, and the second end of the switch 171 is connected to a node 175. The input end of the inverter circuit 173 is connected to the node 175. The inverter circuit 173 outputs, through the output end thereof, an inversion signal of a signal given to the input end thereof. The output signal from the inverter circuit 173 indicates the slave output data $Q_S$. The output end of the inverter circuit 173 is connected to the input end of the inverter circuit 174. The inverter circuit 174 outputs, through the output end thereof, an inversion signal of a signal given to the input end thereof. Therefore, an inversion signal of the signal indicating the slave output data $Q_S$ is outputted from the output end of the inverter circuit 174. The first end of the switch 172 is connected to the output end of the inverter circuit 174, and the second end of the switch 172 is connected to the node 175.

Figure 6A:
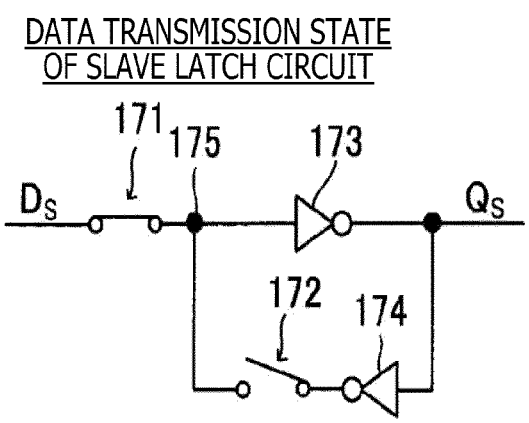
FIGS. 6A and 6B illustrate explanatory diagrams of a data transmission state and a data holding state of the slave latch circuit according to the first embodiment of the present disclosure.
Figure 6B:
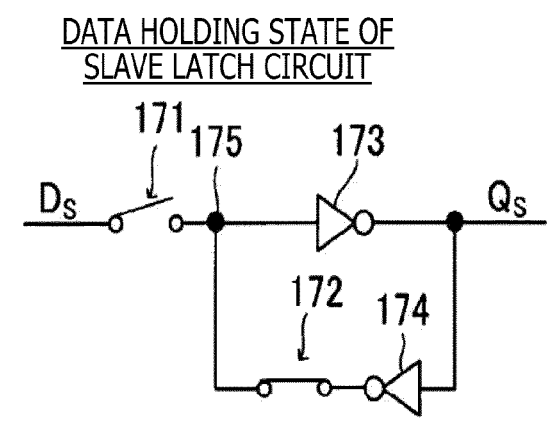

The slave clock signal $CLK_S$ is inputted to the control end of the switch 171. An inversion signal $CLK_S\_B$ of the slave clock signal $CLK_S$ is inputted to the control end of the switch 172. Therefore, when the slave clock signal $CLK_S$ is at a high level, the switch 171 is in the ON state while the switch 172 is in the OFF state so that the slave latch circuit 170 is in a data transmission state. When the slave clock signal $CLK_S$ is at a low level, the switch 171 is in the OFF state while the switch 172 is in the ON state so that the slave latch circuit 170 is in a data holding state. FIGS. 6A and 6B schematically illustrate the data transmission state and the data holding state of the slave latch circuit 170.

During the data transmission state of the slave latch circuit 170, the current slave input data $D_S$ is directly outputted as the slave output data $Q_S$. It is to be noted that, during the data transmission state of the slave latch circuit 170, the signal level indicating the data $D_S$ is the inverse of the signal level indicating the data $Q_S$, but the data $D_S$ is defined on the basis of a negative logic and the data $Q_S$ is defined on the basis of a positive logic, as explained later. For this reason, during the data transmission state of the slave latch circuit 170, the logical value of the data $D_S$ is identical to the logical value of the data $Q_S$. This condition is represented by the expression that "the current slave input data $D_S$ is directly outputted as the slave output data $Q_S$." During the data holding state of the slave latch circuit 170, data held in the node 175 is outputted as the slave output data $Q_S$ by means of the inverter circuit 174, independently of the current slave input data $D_S$. That is, in the slave latch circuit 170, the slave input data $D_S$ is taken by the slave latch circuit 170 in synchronization with an up-edge of the slave clock signal $CLK_S$, and the taken data is latched (held) by the slave latch circuit 170 in synchronization with a down-edge of the slave clock signal $CLK_S$. When the slave clock signal $CLK_S$ is fixed to a low level after the up-edge and the down-edge of the slave clock signal $CLK_S$, the data holding state in which the data taken by the slave latch circuit 170 is held in the slave latch circuit 170 is continued.

The specific configurations of the master latch circuit 111 and the slave latch circuit 112 in FIG. 1 are defined optionally. Here, it is assumed that the master latch circuit 160 in FIG. 3 and the slave latch circuit 170 in FIG. 5 are used as the master latch circuit 111 and the slave latch circuit 112, respectively. Accordingly, the data $D_{IN}$, $D_M$, $Q_S$, and $Q_{OUT}$ are defined on the basis of a positive logic, and the data $Q_M$ and $D_S$ are defined on the basis of a negative logic. That is, when the signal level of a signal indicating attention data which is the data $D_{IN}$, $D_M$, $Q_S$, or $Q_{OUT}$ is a high level or a low level, the attention data has a logical value of "1" or "0," respectively. In contrast, when the signal level of a signal indicating attention data which is the data $Q_M$ or $D_S$ is a high level or a low level, the attention data has a logical value of "0" or "1," respectively. However, a method for defining the positive logic or the negative logic can optionally be changed.

It is to be noted that, regarding any latch circuit, an input of a signal indicating certain data to the latch circuit is synonymous with an input of the certain data to the latch circuit, and an output of a signal indicating certain data from the latch circuit is synonymous with an output of the certain data from the latch circuit. Therefore, for example, an input of a signal indicating the master input data $D_M$ to a master latch circuit may be expressed as an input of the master input data $D_M$ to a master latch circuit, and an output of a signal indicating the master output data $Q_M$ from a master latch circuit may be expressed as an output of the master output data $Q_M$ from a master latch circuit. The same applies not only to a latch circuit but also to a selector, etc., and further, applies to the other embodiments which will be explained later.

Figure 7:
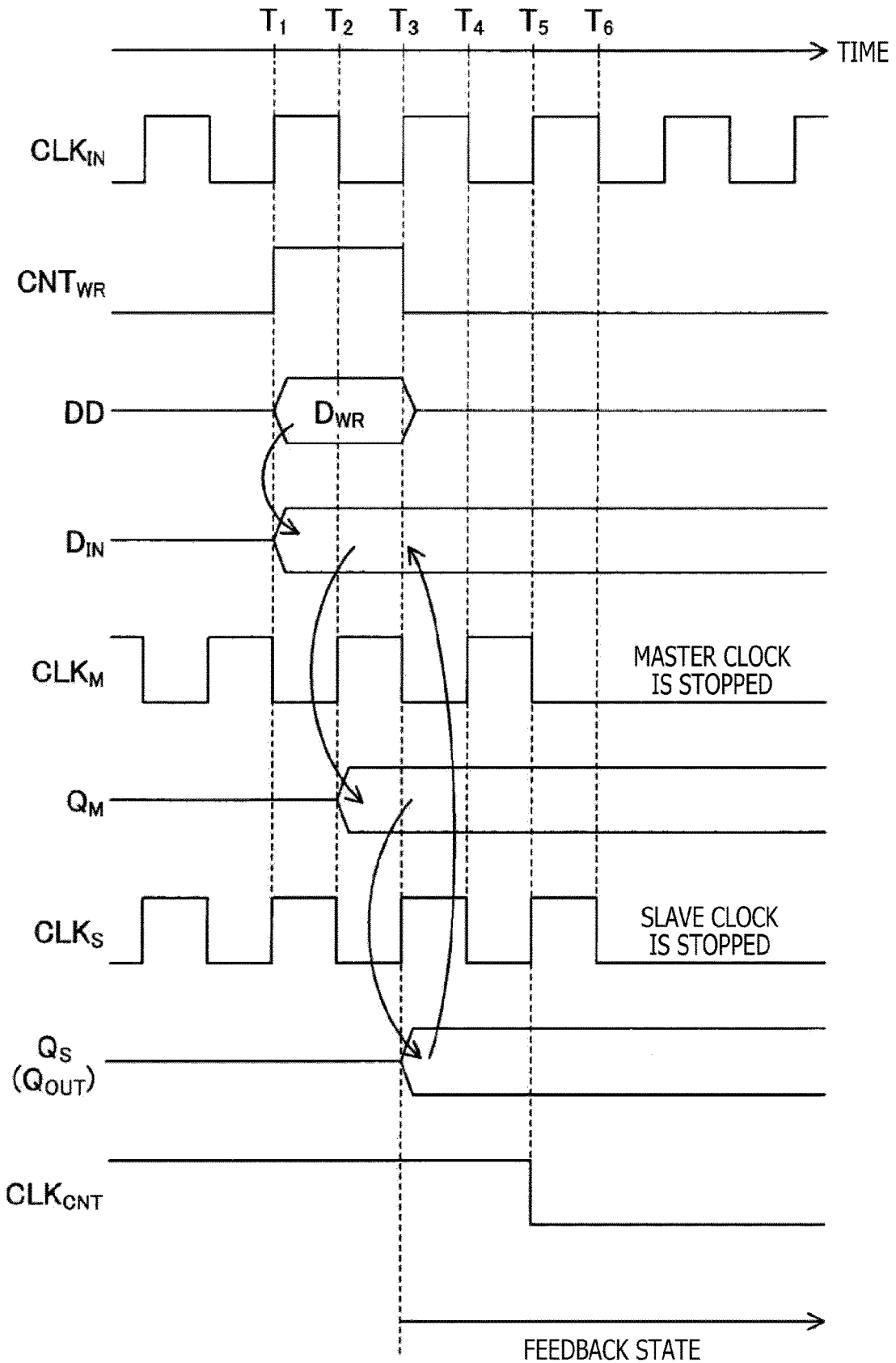
FIG. 7 is a timing chart of the data storage circuit according to the first embodiment of the present disclosure.

FIG. 7 is a timing chart of the data storage circuit 100. It is assumed that an up-edge of the reference clock signal $CLK_{IN}$ occurs at a timing $T_1$. Further, regarding an optional integer i, it is assumed that a timing $T_{i+1}$ is later than a timing $T_i$ by a half of the cycle of the reference clock signal $CLK_{IN}$, and that the duty of the reference clock signal $CLK_{IN}$ is 50%. Accordingly, timings $T_1$, $T_3$, and $T_5$ are three successive up-edge timings of the reference clock signal $CLK_{IN}$, and timings $T_2$, $T_4$, and $T_6$ are three successive down-edge timings of the reference clock signal $CLK_{IN}$.

The value of the writing control signal $CNT_{WR}$ is generally set to "0," but the value of the writing control signal $CNT_{WR}$ is set to "1" only during a section required to write the write target data $D_{WR}$ into the FF 110. In the example in FIG. 7, the value of the writing control signal $CNT_{WR}$ is set to "1" only during a section from the timing $T_1$ to the timing $T_3$, and is set to "0" during the other sections. During a section from the timing $T_1$ to the timing $T_3$, data to be written into the FF 110 (in other words, data to be stored and held in the FF 110) is inputted as the write target data $D_{WR}$ to the second input end of the selector 140. Therefore, during the section from the timing $T_1$ to the timing $T_3$, the input data $D_{IN}$ is identical to the write target data $D_{WR}$ which is input data to the second input end of the selector 140. The data DD which is inputted to the second input end of the selector 140 during sections other than the section from the timing $T_1$ to the timing $T_3$, may be indefinite data.

In the example in FIG. 7, the clock validity control signal $CLK_{CNT}$ has a value of "1" until the timing $T_5$. Therefore, at least until the timing $T_5$, level changes of the clock signals $CLK_M$ and $CLK_S$ occur in synchronization with the level change of the reference clock signal $CLK_{IN}$.

As a result, the write target data $D_{WR}$ is taken by the master latch circuit 111 in synchronization with an up-edge of the master clock signal $CLK_M$ at the timing 12, and the master output data $Q_M$ becomes identical to the write target data $D_{WR}$. The master output data $Q_M$ which is identical to the write target data $D_{WR}$ is taken by the slave latch circuit 112 in synchronization with an up-edge of the slave clock signal $CLK_S$ at the following timing $T_3$, and the slave output data $Q_S$ and the output data $Q_{OUT}$ become identical to the write target data $D_{WR}$ (that is, the value of the slave output data $Q_S$ and the value of the output data $Q_{OUT}$ are identical to the value of the write target data $D_{WR}$).

In the example in FIG. 7, the value of the writing control signal $CNT_{WR}$ is changed from "1" to "0" at the timing $T_3$, but data having a value identical to the value of the write target data $D_{WR}$ comes out as the output data $Q_{OUT}$ since the timing $T_3$. Thus, from the timing $T_1$ and even after the timing $T_3$, the input data $D_{IN}$ continuously has a value identical to the value of the write target data $D_{WR}$.

After the write target data $D_{WR}$ inputted as the input data $D_{IN}$ to the data input terminal $110_{IN}$ through the selector 140 is taken by both the master latch circuit 111 and the slave latch circuit 112, the clock control circuit 120 stops the level changes of the clock signals $CLK_M$ and $CLK_S$ so that the clock control circuit 120 is shifted to the clock stop state of fixing the signal level of the clock signal $CLK_M$ and the signal level of the clock signal $CLK_S$ to a low level. During the clock stop state, both the master latch circuit 111 and the slave latch circuit 112 are in the data holding state.

The clock validity control circuit 130 sets the value of the clock validity control signal $CLK_{CNT}$ to "1" until the value of the writing control signal $CNT_{WR}$ is changed from "1" to "0," and changes the value of the clock validity control signal $CLK_{CNT}$ from "1" to "0" after the value of the writing control signal $CNT_{WR}$ is changed from "1" to "0." Thereafter, the clock validity control circuit 130 may fix the value of the signal $CLK_{CNT}$ to "0." However, a timing of changing the value of the clock validity control signal $CLK_{CNT}$ from "1" to "0" is set to be later than a timing at which the write target data $D_{WR}$ comes out as the slave output data $Q_S$.

After the value of the signal $CLK_{CNT}$ is changed from "1" to "0," the clock control circuit 120 stops the level change of the master clock signal $CLK_M$ such that the signal level of the master clock signal $CLK_M$ is fixed to a low level and stops the level change of the slave clock signal $CLK_S$ such that the signal level of the slave clock signal $CLK_S$ is fixed to a low level. Hereinafter, "stopping the level change of the master clock signal $CLK_M$ such that the signal level of the master clock signal $CLK_M$ is fixed to a low level" may be referred to as stoppage of the master clock, and "stopping the level change of the slave clock signal $CLK_S$ such that the signal level of the slave clock signal $CLK_S$ is fixed to a low level" may be referred to as stoppage of the slave clock (this applies to other following embodiments).

In the example in FIG. 7, since the value of the signal $CLK_{CNT}$ is changed from "1" to "0" at the timing $T_5$, the master clock and the slave clock are stopped at the timing $T_5$ or after the timing $T_5$. However, the master clock may be stopped at any timing and the slave clock may be stopped at any timing as long as these timing are set posterior to a timing at which the write target data $D_{WR}$ comes out as the slave output data $Q_S$. Stoppage of the master clock may be followed by stoppage of the slave clock, and vice versa.

However, there is a possibility that the operation of the master latch circuit 111 become unstable when the master clock is stopped immediately after the level of the master clock signal $CLK_M$ becomes high. Thus, it is preferable to stop the master clock when the master clock signal $CLK_M$ is at a low level. Similarly, the slave clock may be spotted while the slave clock signal $CLK_S$ is at a low level. Alternatively, for example, the master clock and the slave clock may be simultaneously stopped at the exactly middle timing between the timing $T_5$ and the timing $T_6$.

The clock control circuit 120 and the clock validity control circuit 130 are illustrated as separate circuits in FIG. 1, but it can be considered that the circuit 130 is included in the circuit 120.

In the clock stop state which is established by stoppage of the master clock and the slave clock, both the master latch circuit 111 and the slave latch circuit 112 hold the write target data $D_{WR}$. However, due to the influence of radioactive rays or the like, data held in the latch circuit 111 or 112 is inverted from "1" to "0" or from "0" to "1" in some cases. This inversion is regarded as an error. Examples of such an error include a hard error which is caused by a physical failure, and a soft error which is occurrence of a temporary malfunction due to the influence of radioactive rays or the like. The present description mainly focuses on a soft error.

During the clock stop state, the error detection circuit 113 compares the master output data $Q_M$ with the slave output data $Q_S$, outputs a signal $S_{ERR}$ having a value of "0" when the value of the data $Q_M$ is identical to the value of the data $Q_S$, and outputs a signal $S_{ERR}$ having a value of "1" when the value of the data $Q_M$ is not identical to the value of the data $Q_S$. The signal $S_{ERR}$ having a value of "1" functions as a prescribed error detection signal to indicate that an error has occurred. The signal $S_{ERR}$ having a value of "0" does not function as the prescribed error detection signal. In addition, the signal $S_{ERR}$ that is outputted when the FF 110 is not in the clock stop state is invalid. The error detection circuit 113 can be formed of a simple comparison circuit such as an exclusive or circuit.

The signal $S_{ERR}$ is supplied to a higher rank control circuit (not illustrated). Upon receiving the signal $S_{ERR}$ (i.e., an error detection signal) having a value of "1" during the clock stop state, the higher rank control circuit executes a prescribed error handling process. For example, the error handling process may involve resetting the entirety of an apparatus that includes the data storage circuit 100 and the higher rank control circuit, stopping the operation of a circuit that is operating by using the output data $Q_{OUT}$ from the data storage circuit 100, or writing the write target data $D_{WR}$ into the FF 110 again.

With the data storage circuit 100, a soft error can be detected by use of outputs from the master latch circuit 111 and the slave latch circuit 112 which are normally included in the flip flop circuit 110, as explained previously. In order to achieve this detection, it is sufficient to add only the error detection circuit 113 and the clock control circuit 120 which can be formed of simple comparison circuits. Thus, the overhead can also be reduced. It is to be noted that not only a soft error caused by radioactive rays but also a soft error caused by noise, crosstalk, or the like can be detected.

Also, in the aforementioned configuration, the write target data $D_{WR}$ is supplied to the data input terminal $110_{IN}$ by the selector 140 that is in the second selection state, and the write target data $D_{WR}$ is taken by the master latch circuit 111 and the slave latch circuit 112, and then, the selector 140 is shifted from the second selection state to the first selection state. That is, the selector 140 is shifted to a state (this state is referred to as feedback state) of continuously supplying the output data $Q_{OUT}$, which is identical to the write target data $D_{WR}$, to the data input terminal $110_{IN}$, and the clock control circuit 120 is shifted to the clock stop state.

Accordingly, it is sufficient that the master clock and the slave clock are stopped at any timings and in any order as long as the write target data $D_{WR}$ has been taken by the master latch circuit 111 and the slave latch circuit 112. Therefore, any complicated configuration is not required for the clock control circuit 120, and any complicated adjustment of the timings is not required, either. This leads to reduction of overhead concerning countermeasures against soft errors.

It is to be noted that, although the error detection circuit 113 is disposed inside the FF 110 in FIG. 1, the error detection circuit 113 may be disposed outside the FF 110. In either case, the circuit area of the error detection circuit 113 itself does not change. However, in order to suppress an increase of the occupation rate of wiring by shortening the wiring length, it is preferable to form a compactly defined library by disposing the error detection circuit 113 in the FF 110 so as to combine the circuits 111 to 113 together.

The first embodiment encompasses the following examples EX1_1 to EX1_4. Unless noted otherwise and unless inconsistent with the context, the matters aforementioned in the first embodiment are applied to the following examples EX1_1 to EX1_4. If any of the examples includes an inconsistency with the matters aforementioned in the first embodiment, a preference may be offered to the explanation of the example. Further, a matter described in any one of the examples EX1_1 to EX1_4 can be applied to another example, unless inconsistent with the context (that is, two or more of the examples can optionally be combined).

EXAMPLE EX1_1

Example EX1_1 is explained. The selector 140 is not necessarily provided in the data storage circuit 100 in FIG. 1. In this case, the data DD is directly inputted to the data input terminal $110_{IN}$. Further, in this case, the value of the clock validity control signal $CLK_{CNT}$ is generally set to "1," but the value of the signal $CLK_{CNT}$ is switched from "1" to "0" after the write target data $D_{WR}$ inputted as the data DD to the data input terminal $110_{IN}$ is taken by both the master latch circuit 111 and the slave latch circuit 112. In the state where the write target data $D_{WR}$ is held in both the master latch circuit 111 and the slave latch circuit 112, the master clock may be first stopped, and then, the slave clock may be stopped.

EXAMPLE EX1_2

Example EX1_2 is explained. FIG. 1 illustrates only one FF 110. However, a plurality of FFs 110 may be provided in the data storage circuit 100. Then, if one clock control circuit 120 is allocated to FFs 110 that are operable by the same clock, overhead caused by installation of the clock control circuit 120 can be minimized. In particular, in a case where there are a plurality of FFs 110 that are operable by the same clock, overhead caused by installation of the clock control circuit 120 can be made so small that the overhead can be ignored.

In a simple example, an attention is focused on two FFs 110 that are operable by the same clock. FIG. 8 illustrates a configuration of a data storage circuit 100' which is the data storage circuit 100 provided with the two FFs 110. The data storage circuit 100' includes two blocks each including the FF 110 and the selector 140. In each of the blocks, the configuration of the FF 110, the configuration of the selector 140, the connection relation therebetween, and input/output data thereof are the same as those described above. In example EX1_2, a first block refers to a block including one FF 110 and one selector 140, and a second block refers to a block including the other FF 110 and the other selector 140.

As circuits that are allocated to be shared by the first and second blocks, one clock control circuit 120 and one clock validity control circuit 130 are provided to the data storage circuit 100'.

The clock validity control circuit 130 in the data storage circuit 100' sets the value of the clock validity control signal $CLK_{CNT}$ to "1" until the value of the writing control signal $CNT_{WR}$ being supplied to the selector 140 in each of the blocks is changed from "1" to "0." After the value of the writing control signal $CNT_{WR}$ being supplied to the selector 140 in each of the blocks is changed from "1" to "0," the clock validity control circuit 130 changes the value of the clock validity control signal $CLK_{CNT}$ from "1" to "0." Thereafter, the value of the signal $CLK_{CNT}$ may be fixed to "0." However, a timing of changing the value of the clock validity control signal $CLK_{CNT}$ from "1" to "0" is set to be later than a timing at which the write target data $D_{WR}$ comes out as the slave output data $Q_S$ in each of the FFs 110.

The writing control signal $CNT_{WR}$ to be supplied to the selectors 140 in the first and second blocks may be a single writing control signal $CNT_{WR}$ to be supplied to both the first and second blocks. In this case, a timing of writing, into the FF 110, the write target data $D_{WR}$ supplied as the data DD (a timing at which the data is taken by the master latch circuit 111 and the slave latch circuit 112 in the FF 110) is the same in both the first and second blocks. Different writing control signals $CNT_{WR}$ may be supplied to the first block and the second block. In this case, a timing of writing, into the FF 110, the write target data $D_{WR}$ supplied as the data DD (a timing at which the data is taken by the master latch circuit 111 and the slave latch circuit 112 in the FF 110) is different between the first block and the second block.

The operation of the clock control circuit 120 is the same as that described above. After writing the write target data $D_{WR}$ into the respective FFs 110 in the first and second blocks is completed (that is, after the write target data $D_{WR}$ is taken by both the master latch circuit 111 and the slave latch circuit 112 in each of the first and second blocks), the clock control circuit 120 stops the master clock and the slave clock, whereby the clock control circuit 120 is shifted to the clock stop state.

A signal $S_{ERR}$ from each block is supplied to a higher rank control circuit (not illustrated). Upon receiving the signal $S_{ERR}$ (i.e., an error detection signal) having a value of "1" from the first or second block during the clock stop state, the higher rank control circuit executes a prescribed error handling process.

The data storage circuit 100' including the first and second blocks has been explained. The same may apply to a data storage circuit including three or more blocks.

Also, the configuration in which the selector 140 is included in each of the blocks has been explained. However, the selector 140 may be deleted from each of the blocks. In this case, the value of the clock validity control signal $CLK_{CNT}$ is generally set to "1," and the value of the signal $CLK_{CNT}$ is switched from "1" to "0" after a writing operation in which the write target data $D_{WR}$ inputted as the data DD to the data input terminal $110_{IN}$ is taken by both the master latch circuit 111 and the slave latch circuit 112, is performed in all the blocks. In the state where the write target data $D_{WR}$ is held in both the master latch circuit 111 and the slave latch circuit 112 in all the blocks, the clock control circuit 120 may first stop the master clock, and then, stop the slave clock.

EXAMPLE EX1_3

Example EX1_3 is explained. The technology of sharing one clock control circuit 120 among a plurality of the FFs 110 has been explained in example EX1_2. The clock control circuits 120 may be allocated to the FFs 110 in one-to-one basis. In this case, the clock control circuits 120 may be incorporated in the corresponding FFs 110. The same may apply to the clock validity control circuit 130.

EXAMPLE EX1_4

Example EX1_4 is explained. In order to reduce overhead caused by installation of the clock control circuit 120, it is desirable that one clock control circuit 120 is shared by a plurality of the FFs 110, similarly to example EX1_2. However, when the sharing is implemented, a wiring for propagating the clock signals $CLK_M$ and $CLK_S$ is extended so that the skew (variation in propagation delays) between the clock signals $CLK_M$ and $CLK_S$ is likely to become large. Due the influence of the skew, an overlap period of time in which the master latch circuit 111 and the slave latch circuit 112 are in the data transmission state at the same time in one of the FFs 110 may occur (see FIG. 9). Depending on the length of the overlap period of time, a malfunction may occur.

Therefore, in a case where one clock control circuit 120 is shared by a plurality of the FFs 110, similarly to example EX1_2, it is preferable to control the skew such that the master latch circuit 111 and the slave latch circuit 112 in each of the FFs 110 are prevented from being in the data transmission state at the same time, or to ensure a non-overlap period of time by performing clock width adjustment, etc. A non-overlap period of time refers to a time period in which both the master clock signal $CLK_M$ and the slave clock signal $CLK_S$ are at a low level, as illustrated in FIG. 10.

Figure 10:
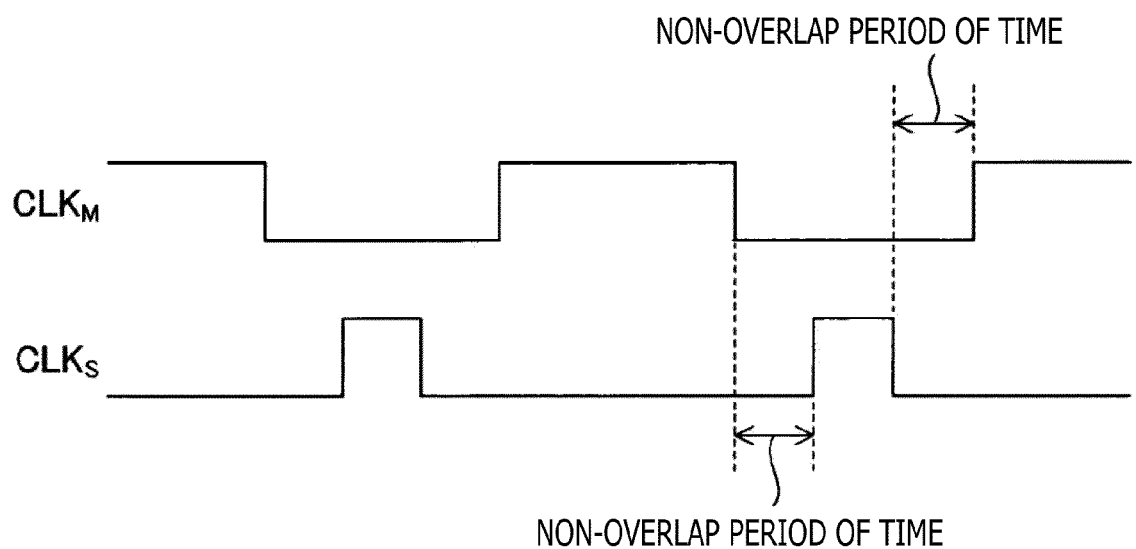
FIG. 10 is a diagram for explaining a non-overlap period of time.

In order to ensure a non-overlap period of time, it is preferable that, during a state other than the clock stop state, the clock control circuit 120 adjust the sum of the duty of the master clock signal $CLK_M$ and the duty of the slave clock signal $CLK_S$ to be smaller than 100%, and then, match the center of a low level section of the master clock signal $CLK_M$ with the center of a high level section of the slave clock signal $CLK_S$ (see FIG. 10). Regarding any clock signal, the duty of the clock signal refers to the ratio of a high level section of the clock signal to the total of the high level section and a low level section of the clock signal.

In a case where a desirable non-overlap period of time is difficult to ensure, the method of example EX1_3 can be adopted.

Second Embodiment

A second embodiment of the present disclosure is explained. The second embodiment and a third embodiment (explained later) are based on the first embodiment. Unless noted otherwise and unless inconsistent with the context, matters in the first embodiment are applied to the second and third embodiments if these matters are not particularly specified in the second and third embodiments. To interpret the explanation of the second embodiment, a preference may be offered to the explanation of the second embodiment if there is an inconsistency between the first and second embodiments (the same applies to the following third embodiment).

Figure 11:
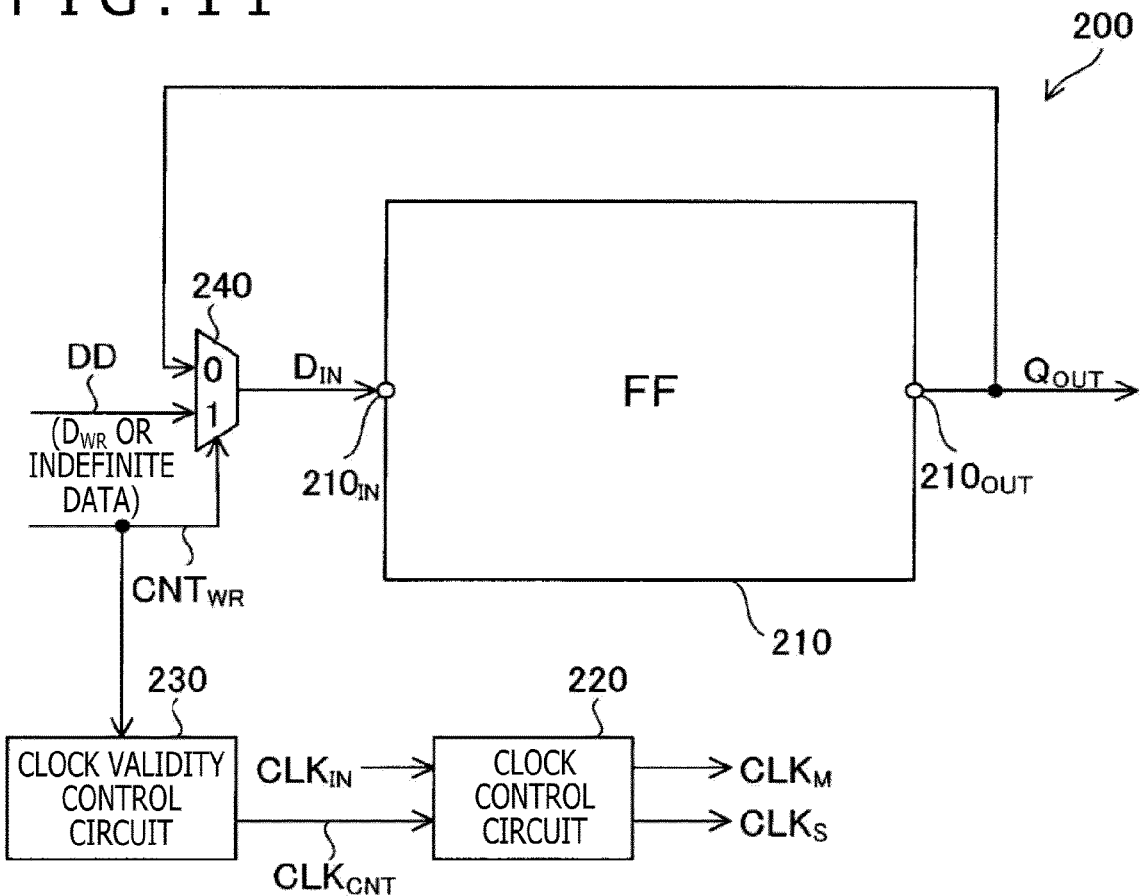
FIG. 11 is a configuration diagram of a data storage circuit according to a second embodiment of the present disclosure.

FIG. 11 is a configuration diagram of a data storage circuit 200 according to the second embodiment. The data storage circuit 200 according to the second embodiment includes a flip flop circuit 210, a clock control circuit 220, a clock validity control circuit 230, and a selector 240. As explained previously, a flip flop circuit may be abbreviated as "FF." The data storage circuit 200 is mainly used for eliminating the necessity of rewriting data after necessary data is once written into the FF 210.

The FF 210 includes a data input terminal $210_{IN}$ and a data output terminal $210_{OUT}$. In the second embodiment, input data $D_{IN}$ refers to data which is inputted to the data input terminal $210_{IN}$, and output data $Q_{OUT}$ refers to data which is outputted from the data output terminal $210_{OUT}$. According to the function of the FF 210, the data storage circuit 200 in FIG. 11 can store the input data $D_{IN}$ (target input data) inputted to the data input terminal $210_{IN}$ and output the output data $Q_{OUT}$ (target output data) through the data output terminal $210_{OUT}$.

A reference clock signal $CLK_{IN}$ is inputted to the clock control circuit 220. The clock control circuit 220 generates a master clock signal $CLK_M$ and a slave clock signal $CLK_S$ based on the reference clock signal $CLK_{IN}$ and supplies the master clock signal $CLK_M$ and the slave clock signal $CLK_S$ to the FF 210. Besides the reference clock signal $CLK_{IN}$, a clock validity control signal $CLK_{CNT}$ from the clock validity control circuit 230 is inputted to the clock control circuit 220. The signal $CLK_{CNT}$ is a binary signal having a value of "1" or "0." The clock control circuit 220 generates the clock signals $CLK_M$ and $CLK_S$ based on the value of the signal $CLK_{CNT}$.

The method for generating the clock signals $CLK_M$ and $CLK_S$ based on the signal $CLK_{CNT}$, and the details of the clock signals $CLK_{IN}$, $CLK_M$, and $CLK_S$ including the relation among the clock signals $CLK_{IN}$, $CLK_M$, and $CLK_S$ are the same as those described in the first embodiment (see FIG. 2). The clock control circuit 220 may be identical to the clock control circuit 120 in FIG. 1.

The clock validity control circuit 230 generates a clock validity control signal $CLK_{CNT}$ based on the writing control signal $CNT_{WR}$ and supplies the clock validity control signal $CLK_{CNT}$ to the clock control circuit 220.

The selector 240 includes a first input end, a second input end, and a control end. In the selector 240, the output data $Q_{OUT}$ from the data output terminal $210_{OUT}$ is inputted to the first input end, data DD is inputted to the second input end, and the writing control signal $CNT_{WR}$ from a write control circuit (not illustrated) is inputted to the control end. To the second input end of the selector 240, the write target data $D_{WR}$ from a data providing unit (not illustrated) may be inputted as the data DD, or indefinite data having no significance value may be inputted as the data DD. The selector 240 selects either data inputted to the first input end or data inputted to the second input end according to the writing control signal $CNT_{WR}$ added to the control end and outputs the selected data. The output data from the selector 240 is supplied as input data $D_{IN}$ to the data input terminal $210_{IN}$. The writing control signal $CNT_{WR}$ is a binary signal having a value of "1" or "0." It is assumed that, when the value of the writing control signal $CNT_{WR}$ is "0," the selector 240 enters a first selection state, and when the value is "1," the selector 240 enters a second selection state. During the first selection state of the selector 240, data (the output data $Q_{OUT}$) inputted to the first input end is selected, and is inputted as the input data $D_{IN}$ to the data input terminal $210_{IN}$. During the second selection state of the selector 240, the data DD inputted to the second input end is selected, and is inputted as the input data $D_{IN}$ to the data input terminal $210_{IN}$.

The FF 210 is a master-slave type flip flop circuit including a master latch circuit and a slave latch circuit and can correct a generated internal error by using multiple master latch circuits or slave latch circuits.

The second embodiment encompasses the following examples EX2_1 to EX2_8. Unless noted otherwise and unless inconsistent with the context, the matters aforementioned in the second embodiment are applied to the following examples EX2_1 to EX2_8. If any of the examples includes an inconsistency with the matters aforementioned in the second embodiment, a preference may be offered to the explanation of the example. Further, a matter described in any one of the examples EX2_1 to EX2_8 may be applied to another example, unless inconsistent with the context (that is, two or more of the examples can optionally be combined).

EXAMPLE EX2_1

Figure 12:
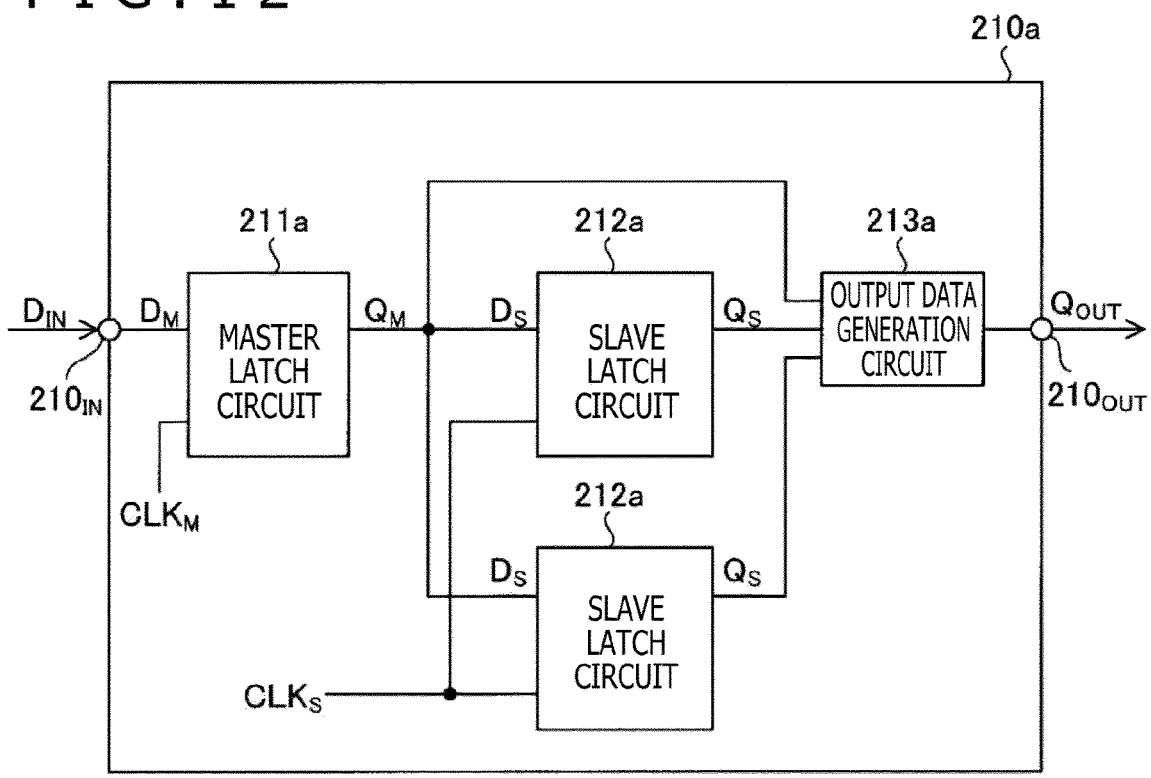
FIG. 12 is an internal configuration diagram of a flip flop circuit according to example EX2_1 which belongs to the second embodiment of the present disclosure.

Example EX2_1 is explained. FIG. 12 illustrates a configuration of the flip flop circuit 210a (FF 210a) according to example EX2_1. In example EX2_1, the FF 210a is used as the FF 210 in FIG. 11. The FF 210a includes one master latch circuit 211a, two slave latch circuits 212a, and an output data generation circuit 213a. In example EX2_1, the one master latch circuit 211a and the two slave latch circuits 212a are referred to as three latch circuits (211a, 212a).

The input data $D_{IN}$ to the data input terminal $210_{IN}$ is inputted as master input data $D_M$ to the master latch circuit 211a. The master latch circuit 211a takes the master input data $D_M$ (i.e., the input data $D_{IN}$) based on the master clock signal $CLK_M$ from the clock control circuit 220, holds the taken data, and outputs the taken data as master output data $Q_M$.

The master output data $Q_M$ from the master latch circuit 211a is inputted as slave input data $D_S$ to each of the slave latch circuits 212a. Each of the slave latch circuits 212a takes the slave input data $D_S$ (i.e., the master output data $Q_M$) based on the slave clock signal $CLK_S$ from the clock control circuit 220, holds the taken data, and outputs the taken data as slave output data $Q_S$.

The output data generation circuit 213a generates output data $Q_{OUT}$ based on the master output data $Q_M$ supplied from the master latch circuit 211a and two sets of slave output data $Q_S$ supplied from the two slave latch circuits 212a and outputs the generated output data $Q_{OUT}$ through the data output terminal $210_{OUT}$.

As explained previously in the first embodiment, each of signals indicating the data $D_{IN}$, $D_M$, $Q_M$, $D_S$, $Q_S$, and $Q_{OUT}$ is a 1-bit digital signal having a signal level that is a low level or a high level. The specific configurations of the master latch circuit 211a and the slave latch circuits 212a in FIG. 12 are defined optionally. In this example, it is assumed that the master latch circuit 160 in FIG. 3 and the slave latch circuits 170 in FIG. 5 are used as the master latch circuit 211a and the slave latch circuits 212a, respectively. Accordingly, the data $D_{IN}$, the data $D_M$, and the data $Q_S$ are defined on the basis of a positive logic, and the data $Q_M$ and the data $D_S$ are defined on the basis of a negative logic. In addition, it is assumed that the output data $Q_{OUT}$ is defined on the basis of a positive logic. A method for defining the positive logic and the negative logic can optionally be changed.

The output data generation circuit 213a generates the output data $Q_{OUT}$, by majority decision, based on one set of the master output data $Q_M$ and two sets of the slave output data $Q_S$. That is, in a state a1 in which all the values of the one set of master output data $Q_M$ and the two sets of slave output data $Q_S$ are "1," the output data generation circuit 213a sets the value of the output data $Q_{OUT}$ also to "1." In a state a2 in which all the values of the one set of master output data $Q_M$ and the two sets of slave output data $Q_S$ are "0," the output data generation circuit 213a sets the value of the output data $Q_{OUT}$ also to "0." In a state a3 in which any two of the data values of the one set of master output data $Q_M$ and the two sets of slave output data $Q_S$ are "1" while the remaining one data value is "0," the output data generation circuit 213a sets the value of the output data $Q_{OUT}$ to "1." In a state a4 in which the values of any two of the one set of master output data $Q_M$ and the two sets of slave output data $Q_S$ are "0" while the value of the remaining one data set is "1," the output data generation circuit 213a sets the value of the output data $Q_{OUT}$ to "0."

After writing the write target data $D_{WR}$ into the FF 210a is completed through the latch in the three latch circuits (211a, 212a), a shift to the clock stop state in which the master clock and the slave clocks are stopped is made. It can be understood that the output data $Q_{OUT}$ that is outputted before the shift to the clock stop state is invalid, and the output data $Q_{OUT}$ that is outputted after completion of the data writing is valid. Subsequently, during the clock stop state, the output data generation circuit 213a generates the valid output data $Q_{OUT}$, by majority decision, based on the one set of master output data $Q_M$ and the two sets of slave output data $Q_S$. As a result, even if an error has occurred in any one of the latch circuits due to the influence of radioactive rays or the like, data in which the error has been corrected can be generated as the output data $Q_{OUT}$.

In the clock stop state, the aforementioned states a1 and a2 belong to normal states, and the aforementioned states a3 and a4 belong to error states. An error state in example EX2_1 refers to a state in which an error has occurred in any one of the three latch circuits (211a, 212a). This state is equivalent to a state in which the value of any one of the data values of the one set of master output data $Q_M$ and the two sets of slave output data $Q_S$ is different from the other two data values. A normal state refers to a state in which no error has occurred in the three latch circuits (211a, 212a).

Figure 13:
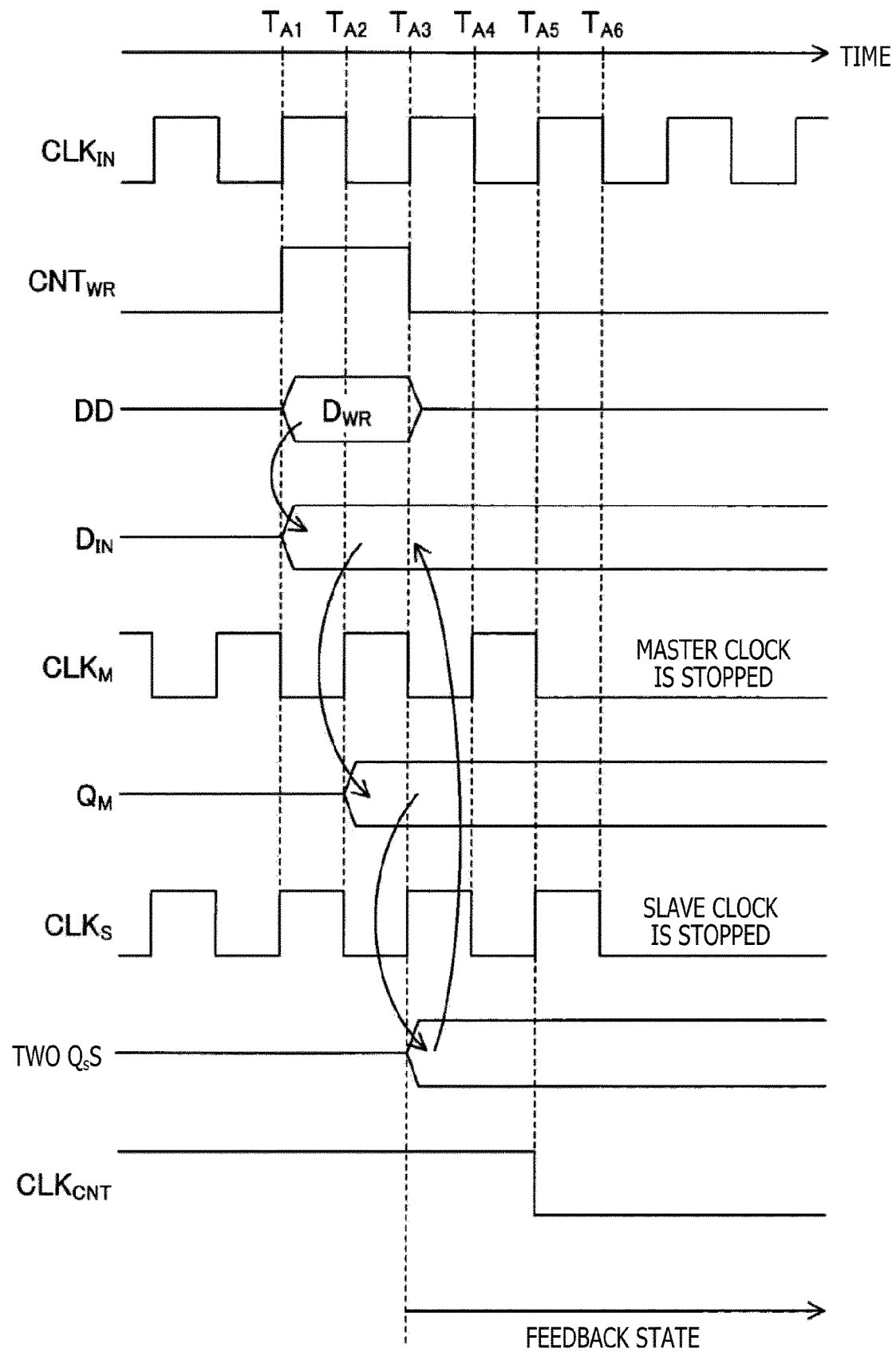
FIG. 13 is a timing chart of a data storage circuit according to example EX2_1 which belongs to the second embodiment of the present disclosure.

FIG. 13 is a timing chart of the data storage circuit 200 according to example EX2_1. It is assumed that an up-edge of the reference clock signal $CLK_{IN}$ occurs at a timing $T_{A1}$. Also, it is assumed that, regarding an optional integer i, a timing $T_{Ai+1}$ is later than a timing $T_{Ai}$ by a half of the cycle of the reference clock signal $CLK_{IN}$, and that the duty of the reference clock signal $CLK_{IN}$ is 50%. Accordingly, timings $T_{A1}$, $T_{A3}$, and $T_{A5}$ are three successive up-edge timings of the reference clock signal $CLK_{IN}$, and timings $T_{A2}$, $T_{A4}$, and $T_{A6}$ are three successive down-edge timings of the reference clock signal $CLK_{IN}$.

The value of the writing control signal $CNT_{WR}$ is generally set to "0," but the value of the writing control signal $CNT_{WR}$ is set to "1" only during a section required to write the write target data $D_{WR}$ into the FF 210a. In the example in FIG. 13, the value of the writing control signal $CNT_{WR}$ is set to "1" only during a section from the timing $T_{A1}$ to the timing $T_{A3}$ and is set to "0" during the other sections. Data to be written into the FF 210a (in other words, data to be stored and held in the FF 210a) during the section from the timing $T_{A1}$ to the timing $T_{A3}$ is inputted as the write target data $D_{WR}$ to the second input end of the selector 240. Therefore, during the section from the timing $T_{A1}$ to the timing $T_{A3}$, the input data $D_{IN}$ is identical to the write target data $D_{WR}$ which is input data to the second input end of the selector 240. The data DD which is inputted to the second input end of the selector 240 during sections other than the section from the timing $T_{A1}$ to the timing $T_{A3}$, may be indefinite data.

In the example in FIG. 13, the clock validity control signal $CLK_{CNT}$ has a value of "1" until the timing $T_{A5}$. Therefore, at least until the timing $T_{A5}$, level changes also occur in the clock signals $CLK_M$ and $CLK_S$ in synchronization with the level change of the reference clock signal $CLK_{IN}$.

As a result, the write target data $D_{WR}$ is taken by the master latch circuit 211a in synchronization with an up-edge of the master clock signal $CLK_M$ at the timing $T_{A2}$, and the master output data $Q_M$ becomes identical to the write target data $D_{WR}$. The master output data $Q_M$, which is identical to the write target data $D_{WR}$, is taken by each of the slave latch circuits 212a in synchronization with an up-edge of the slave clock signal $CLK_S$ at the following timing $T_{A3}$, and two sets of the slave output data $Q_S$ become identical to the write target data $D_{WR}$. As a result, after the timing $T_{A3}$, the output data $Q_{OUT}$ from the output data generation circuit 213a is identical to the write target data $D_{WR}$ (that is, the value of the output data $Q_{OUT}$ is identical to the value of the write target data $D_{WR}$).

In the example in FIG. 13, the value of the writing control signal $CNT_{WR}$ is changed from "1" to "0" at the timing $T_{A3}$, but data having a value identical to the value of the write target data $D_{WR}$ comes out as the output data $Q_{OUT}$ since the timing $T_{A3}$. Thus, from the timing $T_{A1}$ and even after the timing $T_{A3}$, the input data $D_{IN}$ continuously has a value identical to the value of the write target data $D_{WR}$.

After the write target data $D_{WR}$ inputted as the input data $D_{IN}$ to the data input terminal $210_{IN}$ through the selector 240 is taken all of the master latch circuit 211a and the two slave latch circuits 212a, the clock control circuit 220 stops the level changes of the clock signals $CLK_M$ and $CLK_S$ so that the clock control circuit 220 is shifted to the clock stop state of fixing the signal level of the clock signal $CLK_M$ and the signal level of the clock signal $CLK_S$ to a low level. During the clock stop state, all of the three latch circuits (211a, 212a) are in the data holding state.

Until the value of the writing control signal $CNT_{WR}$ is changed from "1" to "0," the clock validity control circuit 230 sets the value of the clock validity control signal $CLK_{CNT}$ to "1." After the value of the writing control signal $CNT_{WR}$ is changed from "1" to "0," the clock validity control circuit 230 changes the value of the clock validity control signal $CLK_{CNT}$ from "1" to "0." Thereafter, the value of the signal $CLK_{CNT}$ may be fixed to "0." However, a timing of changing the value of the clock validity control signal $CLK_{CNT}$ from "1" to "0" is set to be later than a timing at which the write target data $D_{WR}$ comes out as each of the slave output data sets $Q_S$.

After the value of the signal $CLK_{CNT}$ is changed from "1" to "0," the clock control circuit 220 stops the master clock (that is, stops the level change of the master clock signal $CLK_M$ such that the signal level of the master clock signal $CLK_M$ is fixed to a low level), and also stops the slave clock (that is, stops the level change of the slave clock signal $CLK_S$ such that the signal level of the slave clock signal $CLK_S$ is fixed to a low level).

In the example in FIG. 13, since the value of the signal $CLK_{CNT}$ is changed from "1" to "0" at the timing $T_{A5}$, the master clock and the slave clocks are stopped at the timing $T_{A5}$ or after the timing $T_{A5}$. The master clock may be stopped at any timing and the slave clocks may be stopped at any timing as long as these timings are later than a timing at which the write target data $D_{WR}$ comes out as each of the slave output data sets $Q_S$. Stoppage of the master clock may be followed by stoppage of the slave clocks, and vice versa.

However, there is a possibility that the operation of the master latch circuit 211a become unstable if the master clock is stopped immediately after the level of the master clock signal $CLK_M$ becomes high. It is preferable to stop the master clock when the master clock signal $CLK_M$ is at a low level. Similarly, it is preferable to stop the slave clocks when the slave clock signal $CLK_S$ is at a low level. Alternatively, for example, the master clock and the slave clocks may be simultaneously stopped at an exactly middle timing between the timings $T_{A5}$ and $T_{A6}$.

The clock control circuit 220 and the clock validity control circuit 230 are illustrated as separate circuits in FIG. 11, but it can be considered that the circuit 230 is included in the circuit 220.

In the clock stop state which is established by stoppage of the master clock and the slave clocks, all of the three latch circuits (211a, 212a) hold the write target data $D_{WR}$. However, due to the influence of radioactive rays or the like, data held in the latch circuit 211a or 212a is inverted from "1" to "0" or from "0" to "1" in some cases. This inversion is regarded as an error. Examples of such an error include a hard error which is caused by a physical failure, and a soft error which is occurrence of a temporary malfunction due to the influence of radioactive rays or the like. This example mainly focuses on a soft error.

During the clock stop state, the output data generation circuit 213a generates the output data $Q_{OUT}$, by majority decision, based on one set of the master output data $Q_M$ and two sets of the slave output data $Q_S$, as explained previously.

Accordingly, even if an error has occurred in any one of the latch circuits due to the influence of radioactive rays or the like, this error is not reflected in the output data $Q_{OUT}$. That is, data in which the error has been corrected can be generated as the output data $Q_{OUT}$. In order to correct an error, it is sufficient to add one slave latch circuit 212a, the output data generation circuit 213a, and the clock control circuit 220 only. Thus, the correction can be made with overhead much smaller than that in triple modular redundancy (TMR) or the like. It is to be noted that not only a soft error caused by radioactive rays, but also a soft error caused by noise, crosstalk, or the like can be corrected.

Further, in the aforementioned configuration, the write target data $D_{WR}$ is supplied to the data input terminal $210_{IN}$ by the selector 240 that is in the second selection state, the write target data $D_{WR}$ is taken by all of the three latch circuits (211a, 212a), and then, the selector 240 is shifted from the second selection state to the first selection state, that is, is shifted to a state (this state is referred to as feedback state) of continuously supplying, to the data input terminal $210_{IN}$, the output data $Q_{OUT}$ which is identical to the write target data $D_{WR}$, and the clock control circuit 220 is shifted to the clock stop state.

Accordingly, the master clock and the slave clock may be stopped at any timings and in any order as long as these timings are later than a timing at which the write target data $D_{WR}$ is taken by the three latch circuits (211a, 212a). Therefore, any complicated configuration is not required for the clock control circuit 220, and any complicated adjustment of the timings is not required, either.

It is to be noted that, although the output data generation circuit 213a is disposed inside the FF 210a in FIG. 12, the output data generation circuit 213a may be disposed outside the FF 210a. In either case, the circuit area of the output data generation circuit 213a itself does not change. However, in order to suppress an increase of the occupation rate of wiring by shortening the wiring length, it is preferable to form a compactly defined library by disposing the output data generation circuit 213a in the FF 210a so as to combine the circuits 211a to 213a together.

Even if an error (mainly, a soft error) has occurred in one of the three latch circuits (211a, 212a) and the held data is inverted, the error does not affect the output data $Q_{OUT}$ because of the majority decision. However, if an error subsequently occurs in another one of the latch circuits, an error is also generated in the output data $Q_{OUT}$. In order to prevent this situation, a normal-state restoration process for restoring the data held in a latch circuit in which an error has occurred to the original data, may be executed.

During the clock stop state, the output data generation circuit 213a can detect whether or not an error has occurred in any of the three latch circuits (211a, 212a), based on one set of the master output data $Q_M$ and two sets of the slave output data $Q_S$. An error to be detected here is a state where any one of data values of the one set of one master output data $Q_M$ and the two sets of slave output data $Q_S$ is different from the other two data values. When the aforementioned state a3 or a4 is observed during the clock stop state, the output data generation circuit 213a determines that an error has occurred, and outputs a prescribed error detection signal. The clock control circuit 220 may be included in output destinations of the error detection signal.

A normal-state restoration process PRa which is implemented by the clock control circuit 220 is explained with reference to FIG. 14. The value of the write target data $D_{WR}$ to be stored in the FF 210a is defined as a normal value. It is assumed that the feedback state and the clock stop state have been established in the data storage circuit 200 through the operation from the timing $T_{A1}$ to the timing $T_{A6}$ in FIG. 13, and that an error detection signal has been outputted from the output data generation circuit 213a to the clock control circuit 220 at a certain timing during the feedback state and the clock stop state. Upon receiving the error detection signal, the clock control circuit 220 executes the normal-state restoration process PRa based on a temporal cancel of the clock stop state.

In the normal-state restoration process PRa, a process PRa1 of causing a level change of the master clock signal $CLK_M$ in synchronization with the level change of the reference clock signal $CLK_{IN}$ by canceling the stoppage of the master clock is first performed. As a result, the output data $Q_{OUT}$ that is inputted to the data input terminal $210_{IN}$ through the selector 240 and that has a normal value is taken by the master latch circuit 211a so that the value of the master output data $Q_M$ becomes a normal value. If an error has occurred in the master latch circuit 211a, the error is eliminated at this stage.

In the normal-state restoration process, the process PRa1 is followed by a process PRa2 of causing a level change of the slave clock signal $CLK_S$ in synchronization with the level change of the reference clock signal $CLK_{IN}$ by canceling stoppage of the slave clock. As a result, the master output data $Q_M$ that has a normal value is taken by each of the slave latch circuits 212a so that the value of each set of the slave output data $Q_S$ also becomes a normal value. If an error has occurred in one of the slave latch circuits 212a, the error is eliminated at this stage.

After restoring each of the values of the master output data $Q_M$ and the slave output data $Q_S$ to a normal value through the normal-state restoration process PRa that includes the processes PRa1 and PRa2, the clock control circuit 220 returns to the clock stop state in which the master clock and the slave clock are stopped.

Figure 14:
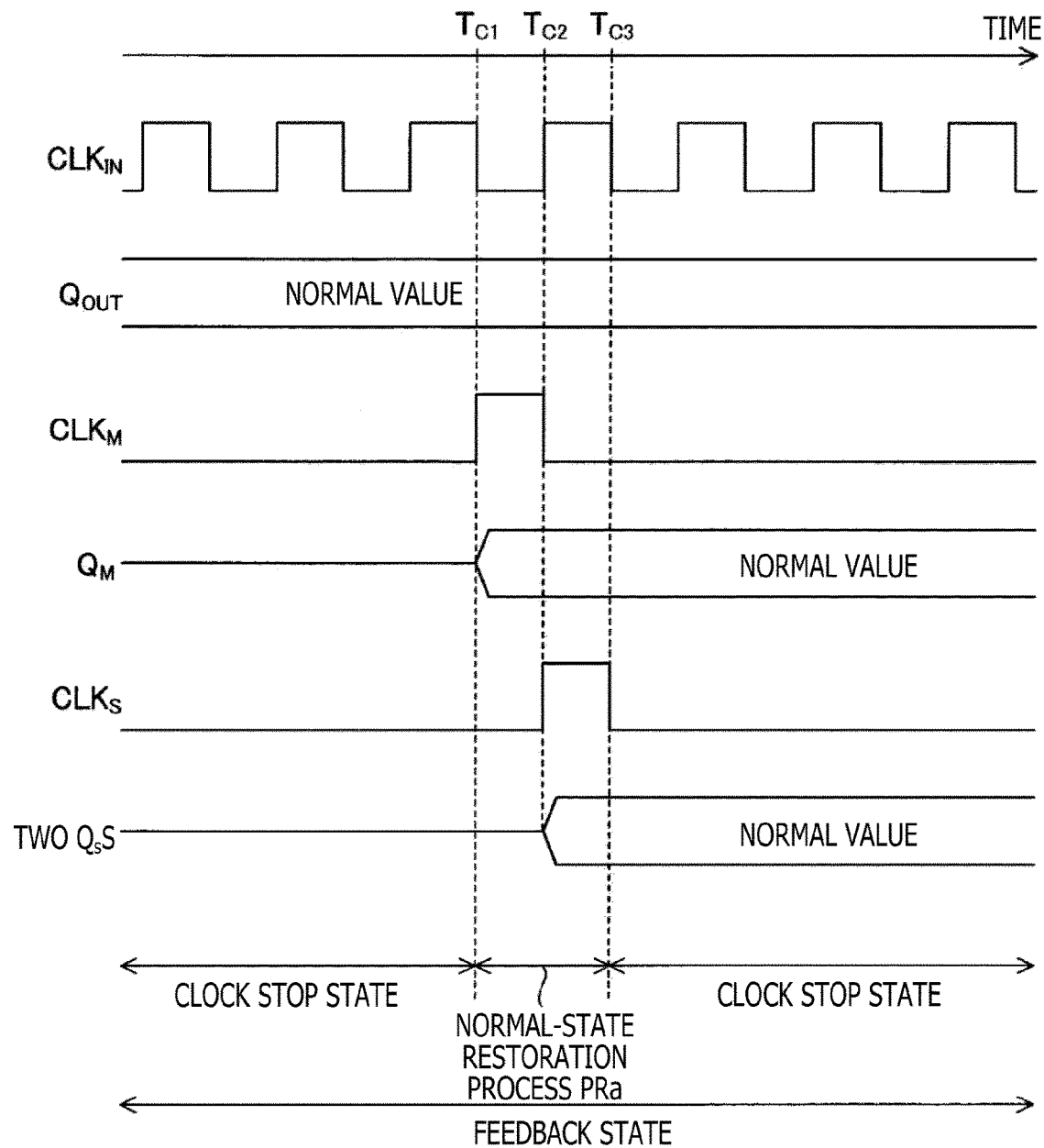
FIG. 14 is a timing chart for explaining a normal-state restoration process according to example EX2_1 which belongs to the second embodiment of the present disclosure.

In the example of the normal-state restoration process PRa illustrated in FIG. 14, an error detection signal is received, and stoppage of the master clock is canceled only during a section from a timing $T_{C1}$ to a timing $T_{C2}$, whereby the process PRa1 is implemented, and stoppage of the slave clock is canceled only during a section from the timing $T_{C2}$ to a timing $T_{C3}$, whereby the process PRa2 is implemented. The timing $T_{C1}$ is one down-edge timing of the reference clock signal $CLK_{IN}$. The timing $T_{C3}$ is the next down-edge timing of the reference clock signal $CLK_{IN}$. The timing $T_{C2}$ is an up-edge timing of the reference clock signal $CLK_{IN}$ during the section from the timing $T_{C1}$ to the timing $T_{C3}$. Therefore, in the example in FIG. 14, an up-edge and a down-edge of the master clock signal $CLK_M$ are generated at the timings $T_{C1}$ and $T_{C2}$, respectively, and an up-edge and a down-edge of the slave clock signal $CLK_S$ are generated at the timings $T_{C2}$ and $T_{C3}$, respectively. As a result, data having a normal value is taken by the master latch circuit 211a in synchronization with the up-edge of the master clock signal $CLK_M$ at the timing $T_{C1}$, and data having a normal value is taken by the slave latch circuits 212a in synchronization with the up-edge of the slave clock signal $CLK_S$ at the timing $T_{C2}$.

In the aforementioned manner, when an error detection signal is outputted from the output data generation circuit 213a, that is, when an error that any one of the data values of the master output data $Q_M$ and the two sets of slave output data $Q_S$ is different from the other data values, is detected after a shift to the feedback state and a shift to the clock stop state, the clock control circuit 220 can execute the normal-state restoration process PRa. In the normal-state restoration process PRa, the clock control circuit 220 temporarily cancels the clock stop state so that data held in the three latch circuits (211a, 212a) is updated by use of the output data $Q_{OUT}$ (output data $Q_{OUT}$ that is expected to have a normal value) supplied by the selector 240 to the data input terminal 210$_{IN}$, and then, the clock control circuit 220 restores the clock stop state.

Accordingly, a data value that has been inverted due to occurrence of an error can easily be restored to a normal value.

EXAMPLE EX2_2

Example EX2_2 is explained. A technology obtained by modifying example EX2_1 is explained in example EX2_2.

The selector 240 is not necessarily provided in the data storage circuit 200 according to example EX2_1. In this case, the data DD is directly inputted to the data input terminal 210$_{IN}$. Further, in this case, the value of the clock validity control signal $CLK_{CNT}$ is generally set to "1," but the value of the signal $CLK_{CNT}$ is switched from "1" to "0" after the write target data $D_{WR}$ inputted as the data DD to the data input terminal 210$_{IN}$ is taken by all of the three latch circuits (211a, 212a). In the state where the write target data $D_{WR}$ is held in all of the three latch circuits (211a, 212a), the master clock may be first stopped, and then, the slave clock may be stopped.

Also in the case where the selector 240 is absent, the normal-state restoration process for restoring held data having an error in the latch circuit to the original data can be executed. In order to implement this process, the data held in the three latch circuits (211a, 212a) may be updated by use of output data $Q_{OUT}$, which is generated by majority decision, when an error detection signal is outputted from the output data generation circuit 213a, that is, when any one of the data values of the master output data $Q_M$ and two sets of the slave output data $Q_S$ is different from the other data values, after a shift to the clock stop state. An update circuit 214a for performing this update may be additionally provided to the FF 210a (see FIG. 15).

Upon receiving the error detection signal, the update circuit 214a inputs the current output data $Q_{OUT}$ (output data $Q_{OUT}$ generated by majority decision) as input data $D_{IN}$ to the data input terminal 210$_{IN}$ of the FF 210a. In the state where this input is being performed, the update circuit 214a temporarily cancels the clock stop state, thereby supplies the clock signals $CLK_M$ and $CLK_S$ to the master latch circuit 211a and the slave latch circuits 212a. In this manner, the above update may be implemented. In order to implement the above update, the update circuit 214a may be able to temporarily cancel the clock stop state by temporarily switching the value of the clock validity control signal $CLK_{CNT}$ from "0" to "1."

EXAMPLE EX2_3

Figure 16:
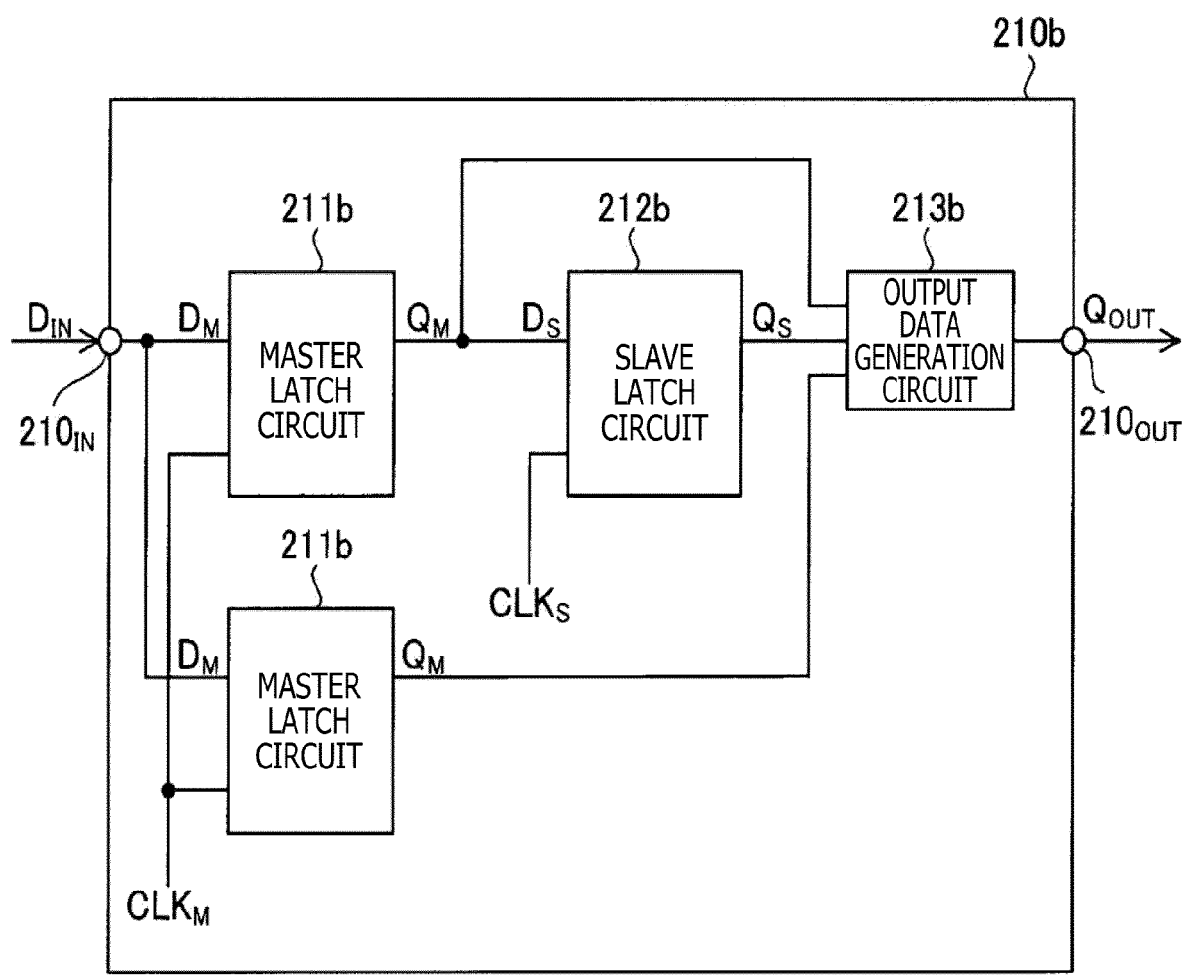
FIG. 16 is an internal configuration diagram of a flip flop circuit according to example EX2_3 which belongs to the second embodiment of the present disclosure.

Example EX2_3 is explained. FIG. 16 illustrates a configuration of a flip flop circuit 210b (FF 210b) according to example EX2_3. In example EX2_3, the FF 210b is used as the FF 210 in FIG. 11. The FF 210b includes two master latch circuits 211b, one slave latch circuit 212b, and an output data generation circuit 213b. In example EX2_3, the two master latch circuits 211b and the one slave latch circuit 212b are referred to as three latch circuits (211b, 212b).

Input data $D_{IN}$ to the data input terminal 210$_{IN}$ is inputted as the master input data $D_M$ to each of the master latch circuits 211b. The master latch circuits 211b each take the master input data $D_M$ (i.e., the input data $D_{IN}$) based on the master clock signal $CLK_M$ from the clock control circuit 220, hold the taken data, and output the taken data as the master output data $Q_M$.

The master output data $Q_M$ from one of the two master latch circuits 211b is inputted as slave input data $D_S$ to the slave latch circuit 212b. The slave latch circuit 212b takes the slave input data $D_S$ (i.e., the master output data $Q_M$ from one of the master latch circuits 211b) based on the slave clock signal $CLK_S$ from the clock control circuit 220, holds the taken data, and outputs the taken data as slave output data $Q_S$.

The output data generation circuit 213b generates the output data $Q_{OUT}$ based on two sets of the master output data $Q_M$ supplied from the two master latch circuits 211b and one set of the slave output data $Q_S$ supplied from the one slave latch circuit 212b, and outputs the generated output data $Q_{OUT}$ through the data output terminal 210$_{OUT}$.

As explained previously in the first embodiment, each of signals indicating the data $D_{IN}$, $D_M$, $Q_M$, $D_S$, $Q_S$, and $Q_{OUT}$ is a 1-bit digital signal having a low level or a high level. The specific configurations of the master latch circuits 211b and the slave latch circuit 212b in FIG. 16 are defined optionally. In this example, it is assumed that the master latch circuits 160 in FIG. 3 and the slave latch circuit 170 in FIG. 5 are used as the master latch circuits 211b and the slave latch circuit 212b, respectively. Accordingly, the data $D_{IN}$, $D_M$, and $Q_S$ are defined on the basis of a positive logic, and the data $Q_M$ and $D_S$ are defined on the basis of a negative logic. It is assumed that the output data $Q_{OUT}$ is defined on the basis of a positive logic. However, a method for defining the positive logic or the negative logic can optionally be changed.

The output data generation circuit 213b generates the output data $Q_{OUT}$, by majority decision, based on the two sets of master output data $Q_M$ and the one set of slave output data $Q_S$. That is, in a state b1 in which all the values of the two sets of master output data $Q_M$ and the one set of slave output data $Q_S$ are "1," the output data generation circuit 213b sets the value of the output data $Q_{OUT}$ also to "1." In a state b2 in which all the values of the two sets of master output data $Q_M$ and the one set of slave output data $Q_S$ are "0," the output data generation circuit 213b sets the value of the output data $Q_{OUT}$ also to "0." In a state b3 in which any two of the data values of the two sets of master output data $Q_M$ and the one set of slave output data $Q_S$ are "1" while the remaining one data value is "0," the output data generation circuit 213b sets the value of the output data $Q_{OUT}$ to "1." In a state b4 in which any two of the data values of the two sets of master output data $Q_M$ and the one set of slave output data $Q_S$ are "0" while the remaining one data value is "1," the output data generation circuit 213b sets the value of the output data $Q_{OUT}$ to "0."

After writing the write target data $D_{WR}$ into the FF 210b is completed through the latch in the three latch circuits (211b, 212b), a shift to the clock stop state in which the master clock and the slave clock are stopped is made. It can be understood that the output data $Q_{OUT}$ that is outputted before the shift to the clock stop state is invalid, and the output data $Q_{OUT}$ that is outputted after completion of the data writing is valid. Subsequently, during the clock stop state, the output data generation circuit 213b generates the valid output data $Q_{OUT}$, by majority decision, based on the two sets of master output data $Q_M$ and the one set of slave output data $Q_S$. As a result, even if an error has occurred in any one of the latch circuits due to the influence of radioactive rays or the like, data in which the error has been corrected can be generated as the output data $Q_{OUT}$.

In the clock stop state, the aforementioned states b1 and b2 belong to normal states, and the aforementioned states b3 and b4 belong to error states. An error state in example EX2_3 refers to a state in which an error has occurred in any one of the three latch circuits (211b, 212b). This state is equivalent to a state in which any one of the data values of the two sets of master output data $Q_M$ and the one set of slave output data $Q_S$ is different from the two remaining data values. A normal state refers to a state in which no error has occurred in the three latch circuits (211b, 212b).

Figure 17:
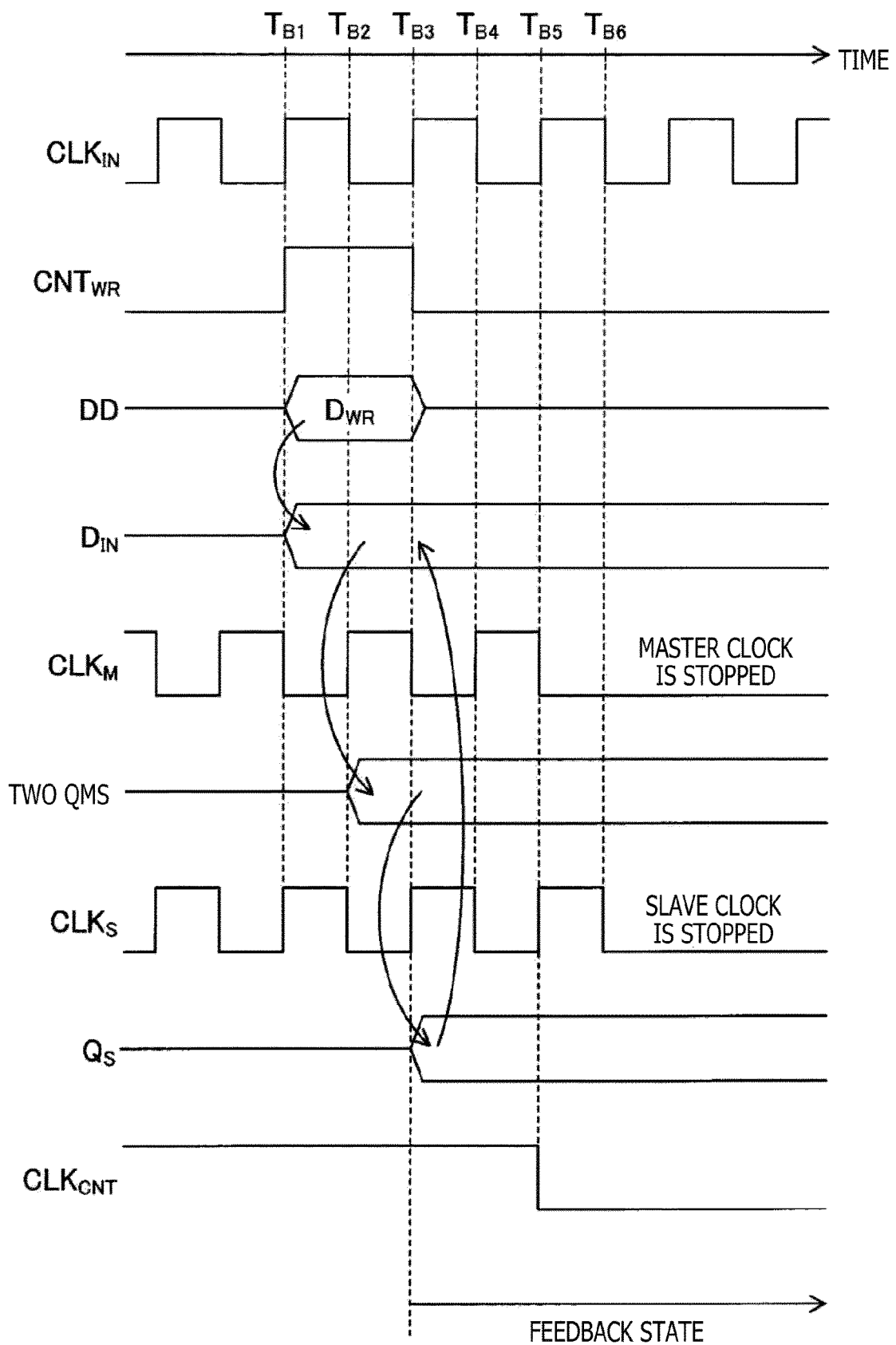
FIG. 17 is a timing chart of a data storage circuit according to example EX2_3 which belongs to the second embodiment of the present disclosure.

FIG. 17 is a timing chart of the data storage circuit 200 according to example EX2_3. It is assumed that an up-edge of the reference clock signal $CLK_{IN}$ occurs at a timing $T_{B1}$. Also, it is assumed that, regarding an optional integer i, a timing $T_{Bi+1}$ is later than a timing $T_{Bi}$ by a half of the cycle of the reference clock signal $CLK_{IN}$, and that the duty of the reference clock signal $CLK_{IN}$ is 50%. Accordingly, timings $T_{B1}$, $T_{B3}$, and $T_{B5}$ are three successive up-edge timings of the reference clock signal $CLK_{IN}$, and timings $T_{B2}$, $T_{B4}$, and $T_{B6}$ are three successive down-edge timings of the reference clock signal $CLK_{IN}$.

The value of the writing control signal $CNT_{WR}$ is generally set to "0," but the value of the writing control signal $CNT_{WR}$ is set to "1" only during a section required to write the write target data $D_{WR}$ into the FF 210b. In the example in FIG. 17, the value of the writing control signal $CNT_{WR}$ is set to "1" only during a section from the timing $T_{B1}$ to the timing $T_{B3}$ and is set to "0" during the other sections. Data to be written into the FF 210b (in other words, data to be stored and held in the FF 210b) during the section from the timing $T_{B1}$ to the timing $T_{B3}$ is inputted as the write target data $D_{WR}$ to the second input end of the selector 240.

Therefore, during the section from the timing $T_{B1}$ to the timing $T_{B3}$, the input data $D_{IN}$ is identical to the write target data $D_{WR}$ which is input data to the second input end of the selector 240. Data DD which is inputted to the second input end of the selector 240 during sections other than the section from the timing $T_{B1}$ to the timing $T_{B3}$, may be indefinite data.

In the example in FIG. 17, the clock validity control signal $CLK_{CNT}$ has a value of "1" until the timing TBS. Therefore, at least until the timing $T_{B5}$, level changes of the clock signals $CLK_M$ and $CLK_S$ occur in synchronization with the level change of the reference clock signal $CLK_{IN}$.

As a result, the write target data $D_{WR}$ is taken by the two master latch circuits 211b in synchronization with an up-edge of the master clock signal $CLK_M$ at the timing $T_{B2}$, and the two sets of the master output data $Q_M$ become identical to the write target data $D_{WR}$. The master output data $Q_M$ identical to the write target data $D_{WR}$ is taken by the slave latch circuit 212b in synchronization with an up-edge of the slave clock signal $CLK_S$ at the following timing $T_{B3}$, and the slave output data $Q_S$ is identical to the write target data $D_{WR}$. As a result, the output data $Q_{OUT}$ from the output data generation circuit 213b is identical to the write target data $D_{WR}$ (that is, the value of the output data $Q_{OUT}$ is identical to the value of the write target data $D_{WR}$) since the timing $T_{B3}$.

In the example in FIG. 17, the value of the writing control signal $CNT_{WR}$ is changed from "1" to "0" at the timing $T_{B3}$, but data having a value identical to the value of the write target data $D_{WR}$ comes out as the output data $Q_{OUT}$ since the timing $T_{B3}$. Thus, from the timing $T_{B1}$ and even after the timing $T_{B3}$, the input data $D_{IN}$ continuously has a value identical to the value of the write target data $D_{WR}$.

After the write target data $D_{WR}$ inputted as the input data $D_{IN}$ to the data input terminal $210_{IN}$ through the selector 240 is taken by all of the two master latch circuits 211b and the one slave latch circuit 212b, the clock control circuit 220 stops the level changes of the clock signals $CLK_M$ and $CLK_S$ so that the clock control circuit 220 is shifted to the clock stop state of fixing the signal level of each of the clock signals $CLK_M$ and $CLK_S$ to a low level. During the clock stop state, all of the three latch circuits (211b, 212b) are in the data holding state.

Until the value of the writing control signal $CNT_{WR}$ is changed from "1" to "0," the clock validity control circuit 230 sets the value of the clock validity control signal $CLK_{CNT}$ to "1." After the value of the writing control signal $CNT_{WR}$ is changed from "1" to "0," the clock validity control circuit 230 changes the value of the clock validity control signal $CLK_{CNT}$ from "1" to "0." Thereafter, the value of the signal $CLK_{CNT}$ may be fixed to "0." However, a timing of changing the value of the clock validity control signal $CLK_{CNT}$ from "1" to "0" is set to be later than a timing at which the write target data $D_{WR}$ comes out as the slave output data $Q_S$.

After the value of the signal $CLK_{CNT}$ is changed from "1" to "0," the clock control circuit 220 stops the master clock (that is, stops the level change of the master clock signal $CLK_M$ such that the signal level of the master clock signal $CLK_M$ is fixed to a low level), and stops the slave clock (that is, stops the level change of the slave clock signal $CLK_S$ such that the signal level of the slave clock signal $CLK_S$ is fixed to a low level).

In the example in FIG. 17, since the value of the signal $CLK_{CNT}$ is changed from "1" to "0" at the timing $T_{B5}$, the master clock and the slave clock are stopped at the timing $T_{B5}$ or after the timing $T_{B5}$. The master clock may be stopped at any timing and the slave clock may be stopped at any timing as long as these timings are later than a timing at which the write target data $D_{WR}$ comes out as the slave output data $Q_S$. Stoppage of the master clock may be followed by stoppage of the slave clocks, and vice versa.

However, there is a possibility that the operation of the master latch circuits 211b become unstable if the master clock is stopped immediately after the level of the master clock signal $CLK_M$ becomes high. It is preferable to stop the master clock when the master clock signal $CLK_M$ is at a low level. Similarly, it is preferable to stop the slave clock while the slave clock signal $CLK_S$ is at a low level. Alternatively, for example, the master clock and the slave clock may be simultaneously stopped at an exactly middle timing between the timings $T_{B5}$ and $T_{B6}$.

The clock control circuit 220 and the clock validity control circuit 230 are illustrated as separate circuits in FIG. 11, but it can be considered that the circuit 230 is included in the circuit 220.

In the clock stop state which is established by stoppage of the master clock and the slave clock, all of the three latch circuits (211b, 212b) hold the write target data $D_{WR}$. However, due to the influence of radioactive rays or the like, data held in the latch circuit 211b or 212b is inverted from "1" to "0" or from "0" to "1" in some cases. This inversion is regarded as an error. Examples of such an error include a hard error which is caused by a physical failure and a soft error which is occurrence of a temporary malfunction due to the influence of radioactive rays or the like. This example mainly focuses on a soft error.

During the clock stop state, the output data generation circuit 213b generates the output data $Q_{OUT}$, by majority decision, based on two sets of the master output data $Q_M$ and one set of the slave output data $Q_S$, as explained previously.

Accordingly, even if an error has occurred in any one of the latch circuits due to the influence of radioactive rays or the like, this error is not reflected in the output data $Q_{OUT}$. That is, data in which the error has been corrected can be generated as the output data $Q_{OUT}$. In order to correct an error, it is sufficient to add one master latch circuit 211b, the output data generation circuit 213b, and the clock control circuit 220 only. Thus, the correction can be made with overhead much smaller than that in TMR or the like. It is to be noted that not only a soft error caused by radioactive rays, but also a soft error caused by noise, crosstalk, or the like can be corrected.

Further, in the aforementioned configuration, the write target data $D_{WR}$ is supplied by the selector 240 that is in the second selection state to the data input terminal $210_{IN}$, the write target data $D_{WR}$ is taken by all of the three latch circuits (211b, 212b), and then, the selector 240 is shifted from the second selection state to the first selection state, that is, to a state (this state is referred to as feedback state) of continuously supplying, to the data input terminal $210_{IN}$, the output data $Q_{OUT}$ which is identical to the write target data $D_{WR}$, and the clock control circuit 220 is shifted to the clock stop state.

Accordingly, it is sufficient to stop the master clock and the slave clock at any timings and in any order as long as the timings are later than a timing at which the write target data $D_{WR}$ is taken by the three latch circuits (211b, 212b). Therefore, any complicated configuration is not required for the clock control circuit 220, and any complicated adjustment of the timings is not required, either.

It is to be noted that, although the output data generation circuit 213b is disposed inside the FF 210b in FIG. 16, the output data generation circuit 213b may be disposed outside the FF 210b. In either case, the circuit area of the output data generation circuit 213b itself does not change. However, in order to suppress an increase of the occupation rate of wiring by shortening the wiring length, it is preferable to form a compactly defined library by disposing the output data generation circuit 213b inside the FF 210b so as to combine the circuits 211b to 213b together.

Even if an error (mainly, a soft error) has occurred in one of the three latch circuits (211b, 212b) and the held data is inverted, the error does not affect the output data $Q_{OUT}$ because of the majority decision. However, if an error subsequently occurs in another one of the latch circuits, an error is also generated in the output data $Q_{OUT}$. In order to prevent this situation, a normal-state restoration process for restoring the data held in a latch circuit in which an error has occurred to the original data may be executed.

During the clock stop state, the output data generation circuit 213b can detect whether or not an error has occurred in any of the three latch circuits (211b, 212b), based on two sets of the master output data $Q_M$ and one set of the slave output data $Q_S$. An error to be detected here is a state where any one of data values of the two sets of master output data $Q_M$ and the one set of slave output data $Q_S$ is different from the other two data values. When the aforementioned state b3 or b4 is observed during the clock stop state, the output data generation circuit 213b determines that an error has occurred, and outputs a prescribed error detection signal. The clock control circuit 220 may be included in output destinations of the error detection signal.

A normal-state restoration process PRb which is implemented by the clock control circuit 220 is explained with reference to FIG. 18. The value of the write target data $D_{WR}$ to be stored in the FF 210b is defined as a normal value. It is assumed that the feedback state and the clock stop state have been established in the data storage circuit 200 through the operation from the timing $T_{B1}$ to the timing $T_{B6}$ in FIG. 17, and that an error detection signal has been outputted from the output data generation circuit 213b to the clock control circuit 220 at a certain timing during the feedback state and the clock stop state. Upon receiving the error detection signal, the clock control circuit 220 executes the normal-state restoration process PRb based on a temporal cancel of the clock stop state.

In the normal-state restoration process PRb, a process PRb1 of causing a level change of the master clock signal $CLK_M$ in synchronization with the level change of the reference clock signal $CLK_{IN}$ by canceling the stoppage of the master clock is first executed. As a result, the output data $Q_{OUT}$ that is inputted to the data input terminal $210_{IN}$ through the selector 240 and that has a normal value is taken by the master latch circuits 211b so that the values of two sets of the master output data $Q_M$ each become normal. If an error has occurred in one of the master latch circuits 211b, the error is eliminated at this stage.

In the normal-state restoration process, the process PRb1 is followed by a process PRb2 of causing a level change of the slave clock signal $CLK_S$ in synchronization with the level change of the reference clock signal $CLK_{IN}$ by canceling stoppage of the slave clock. As a result, the master output data $Q_M$ having a normal value is taken by the slave latch circuit 212b so that the value of the slave output data $Q_S$ also becomes a normal value. If an error has occurred in the slave latch circuit 212a, the error is eliminated at this stage.

After restoring the values of the master output data $Q_M$ and the slave output data $Q_S$ to normal values through the normal-state restoration process PRb including the processes PRb1 and PRb2, the clock control circuit 220 returns to the clock stop state in which the master clock and the slave clock are stopped.

Figure 18:
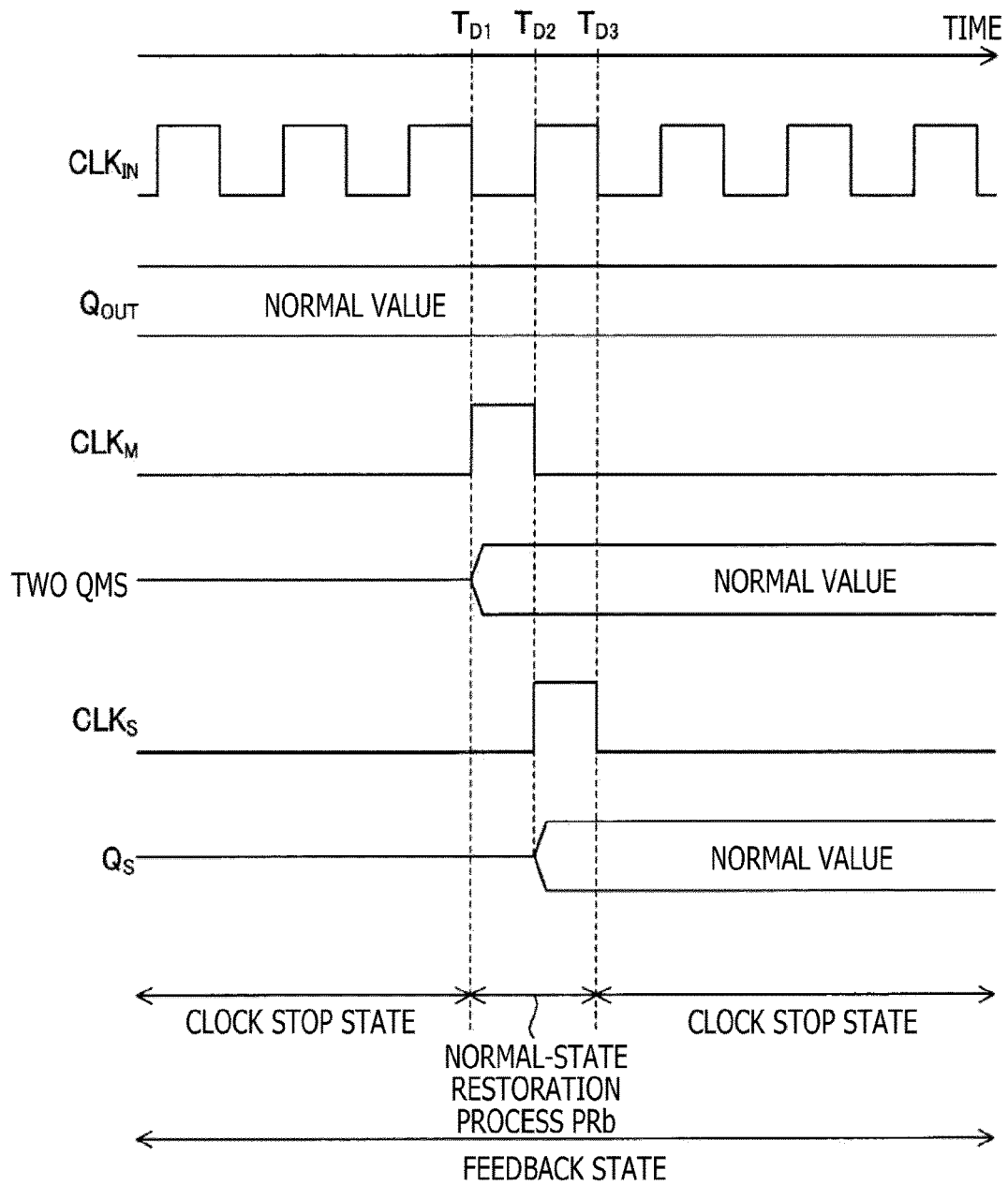
FIG. 18 is a timing chart for explaining a normal-state restoration process according to example EX2_3 which belongs to the second embodiment of the present disclosure.

In the example of the normal-state restoration process PRb illustrated in FIG. 18, an error detection signal is received, and stoppage of the master clock is canceled only during a section from a timing $T_{D1}$ to a timing $T_{D2}$, whereby the process PRb1 is implemented, and stoppage of the slave clock is canceled only during a section from the timing $T_{D2}$ to a timing $T_{D3}$, whereby the process PRa2 is implemented. The timing $T_{D1}$ is one down-edge timing of the reference clock signal $CLK_{IN}$. The timing $T_{D3}$ is the next down-edge timing of the reference clock signal $CLK_{IN}$. The timing $T_{D2}$ is an up-edge timing of the reference clock signal $CLK_{IN}$ during the section from the timing $T_{D1}$ to the timing $T_{D3}$. Therefore, in the example in FIG. 18, an up-edge and a down-edge of the master clock signal $CLK_M$ are generated at the timings $T_{D1}$ and $T_{D2}$, respectively, and an up-edge and a down-edge of the slave clock signal $CLK_S$ are generated at the timings $T_{D2}$ and $T_{D3}$, respectively. As a result, data having a normal value is taken by the master latch circuits 211b in synchronization with the up-edge of the master clock signal $CLK_M$ at the timing $T_{D1}$, and data having a normal value is taken by the slave latch circuit 212b in synchronization with the up-edge of the slave clock signal $CLK_S$ at the timing $T_{D2}$.

Thus, when an error detection signal is outputted from the output data generation circuit 213b, that is, when an error that any one of the data values of the two sets of master output data $Q_M$ and the one set of slave output data $Q_S$ is different from the other data values is detected after a shift to the feedback state and a shift to the clock stop state, the clock control circuit 220 can execute the normal-state restoration process PRb. In the normal-state restoration process PRb, the clock control circuit 220 temporarily cancels the clock stop state so that data held in the three latch circuits (211b, 212b) is updated by use of the output data $Q_{OUT}$ (output data $Q_{OUT}$ that is expected to have a normal value) supplied by the selector 240 to the data input terminal 210$_{IN}$, and then, the clock control circuit 220 restores the clock stop state.

Accordingly, a data value that has been inverted due to occurrence of an error can easily be restored to a normal value.

EXAMPLE EX2_4

Example EX2_4 is explained. In example EX2_4, a technology obtained by modifying example EX2_3 is explained.

The selector 240 is not necessarily provided in the data storage circuit 200 according to example EX2_3. In this case, the data DD is directly inputted to the data input terminal 210$_{IN}$. Further, in this case, the value of the clock validity control signal $CLK_{CNT}$ is generally set to "1," but the value of the signal $CLK_{CNT}$ is switched from "1" to "0" after the write target data $D_{WR}$ inputted as the data DD to the data input terminal 210$_{IN}$ is taken by all of the three latch circuits (211b, 212b). In the state where the write target data $D_{WR}$ is held in all of the three latch circuits (211b, 212b), the master clock may be first stopped, and then, the slave clock may be stopped.

Also in the case where the selector 240 is absent, the normal-state restoration process for restoring held data having an error in the latch circuit to the original data can be executed. In order to implement this process, the data held in the three latch circuits (211b, 212b) may be updated by use of output data $Q_{OUT}$, which is generated by majority decision, when an error detection signal is outputted from the output data generation circuit 213b, that is, when any one of the data values of two sets of the master output data $Q_M$ and one set of the slave output data $Q_S$ is different from the other data values, after a shift to the clock stop state. An update circuit 214b for performing this update may be additionally provided to the FF 210b (see FIG. 19).

Upon receiving the error detection signal, the update circuit 214b inputs the current output data $Q_{OUT}$ (output data $Q_{OUT}$ generated by majority decision) as input data $D_{IN}$ to the data input terminal 210$_{IN}$ of the FF 210b. In the state where this input is being performed, the update circuit 214b temporarily cancels the clock stop state, thereby supplies the clock signals $CLK_M$ and $CLK_S$ to the master latch circuits 211b and the slave latch circuit 212b. In this manner, the above update may be implemented. In order to implement the above update, the update circuit 214b may be able to temporarily cancel the clock stop state by temporarily switching the value of the clock validity control signal $CLK_{CNT}$ from "0" to "1."

EXAMPLE EX2_5

Example EX2_5 is explained. FIG. 11 illustrates only one FF 210. However, a plurality of the FFs 210 may be provided in the data storage circuit 200. Then, if one clock control circuit 220 is allocated to FFs 210 that are operable by the same clock, overhead caused by installation of the clock control circuit 220 can be minimized. In particular, in a case where there are a plurality of FFs 210 that are operable by the same clock, overhead caused by installation of the clock control circuit 220 can be made so small that the overhead can be ignored.

Figure 20:
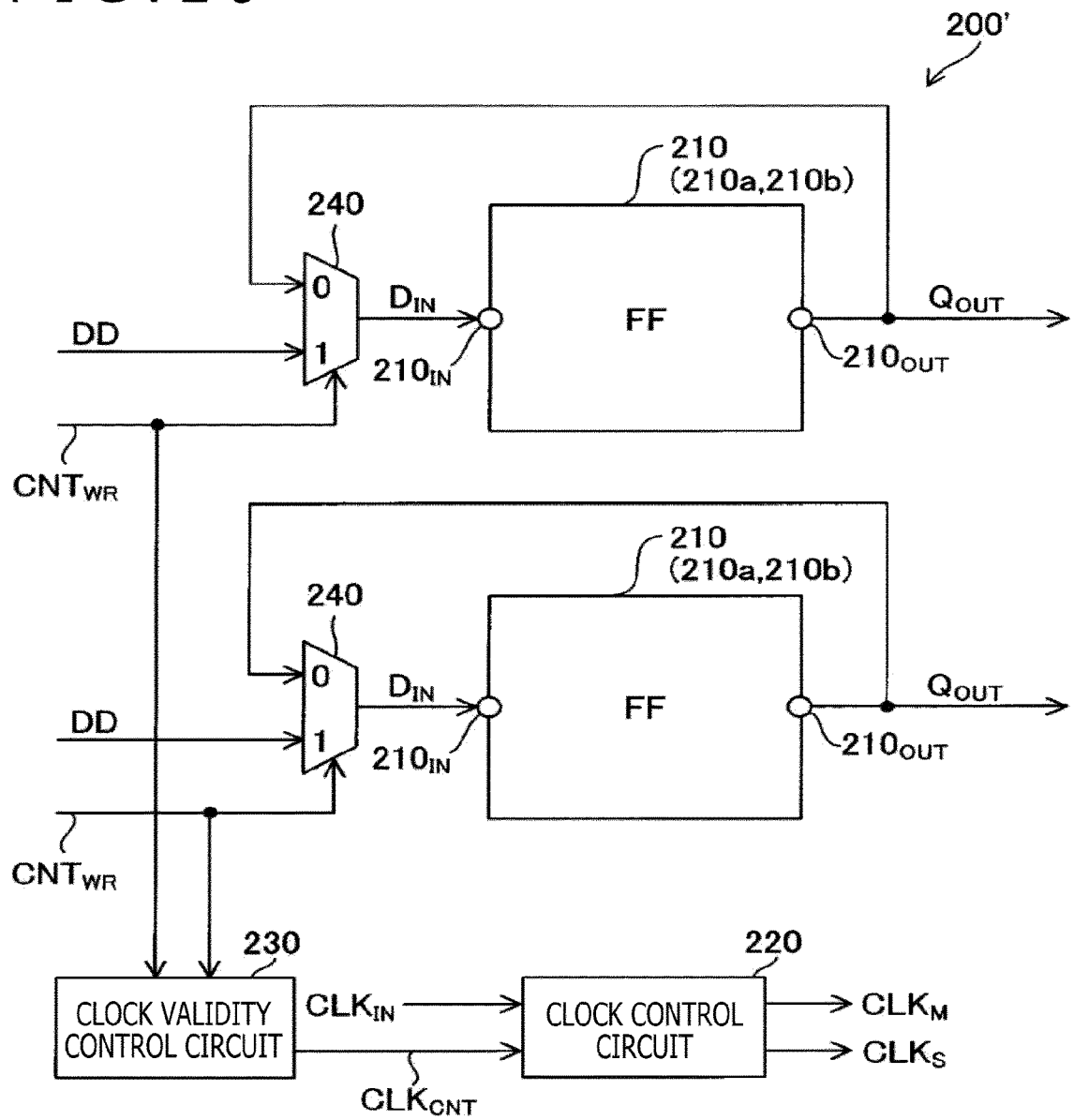
FIG. 20 is a configuration diagram of a data storage circuit according to example EX2_5 which belongs to the second embodiment of the present disclosure.

In a simple example, an attention is focused on two FFs 210 that are operable by the same clock. FIG. 20 illustrates a configuration of a data storage circuit 200' which is the data storage circuit 200 provided with two FFs 210. The data storage circuit 200' includes two blocks each including the FF 210 and the selector 240. In each of the blocks, the configurations of the FF 210, the configurations of the selector 240, the connection relation therebetween, and input/output data thereof are the same as those described above. In example EX2_5, a first block refers to a block including one FF 210 and one selector 240, and a second block refers to a block including the other FF 210 and the other selector 240.

As each of the FFs 210 in example EX2_5 including the two FFs 210 that are provided to the data storage circuit 200', the FF 210a (see FIG. 12) according to example EX2_1 or EX2_2 may be used, or the FF 210b (see FIG. 16) according to example EX2_3 or EX2_4 may be used. In a case where the FFs 210a are used as the FFs 210, three latch circuits, which will be used in the following explanation, refer to one master latch circuit 211a and two slave latch circuits 212a of the FF 210a. In a case where the FFs 210b are used as the FFs 210, three latch circuits, which will be used in the following explanation, refer to two master latch circuits 211b and one slave latch circuit 212b of the FF 210b (the same applies to other examples and to another embodiment which is explained later).

As circuits that are allocated to be shared by the first and second blocks, one clock control circuit 220 and one clock validity control circuit 230 are provided to the data storage circuit 200'.

The clock validity control circuit 230 in the data storage circuit 200' sets the value of the clock validity control signal $CLK_{CNT}$ to "1" until the value of the writing control signal $CNT_{WR}$ being supplied to the selector 240 in each of the blocks is changed from "1" to "0." After the value of the writing control signal $CNT_{WR}$ being supplied to the selector 240 in each of the blocks is changed from "1" to "0," the clock validity control circuit 230 changes the value of the clock validity control signal $CLK_{CNT}$ from "1" to "0." Thereafter, the value of the signal $CLK_{CNT}$ may be fixed to "0." However, a timing of changing the value of the clock validity control signal $CLK_{CNT}$ from "1" to "0" is set to be later than a timing at which the write target data $D_{WR}$ comes out as the slave output data $Q_S$ in each of the FFs 210.

The writing control signal $CNT_{WR}$ being supplied to the selectors 240 in the first and second blocks may be a single writing control signal $CNT_{WR}$ to be supplied to both the first and second blocks. In this case, a timing of writing, into the FF 210, the write target data $D_{WR}$ supplied as the data DD (a timing at which the data is taken by the three latch circuits in the FF 210) is the same in both the first and second blocks. Different writing control signals $CNT_{WR}$ may be supplied to the first block and the second block. In this case, a timing of writing, into the FF 210, the write target data $D_{WR}$ supplied as the data DD (a timing at which the data is taken by the three latch circuits in the FF 210) is different between the first block and the second block.

The operation of the clock control circuit 220 is the same as that described above. After writing the write target data $D_{WR}$ into the respective FFs 210 in the first and second blocks is completed (that is, after the write target data $D_{WR}$ is taken by the three latch circuits in each of the first and second blocks), the clock control circuit 220 is shifted to the clock stop state by stopping the master clock and the slave clock.

On the other hand, after writing the write target data $D_{WR}$ into the respective FFs 210 in the first and second blocks is completed (that is, after the write target data $D_{WR}$ is taken by all of the three latch circuits in each of the first and second blocks), the value of the writing control signal $CNT_{WR}$ in each of the blocks becomes "0," whereby a shift to the feedback state is made.

When an error is detected in either one of the blocks after a shift to the feedback state and a shift to the clock stop state, that is, when an error detection signal is outputted from the output data generation circuit (213a or 213b) provided in the FF 210 of either one of the blocks according to the method described in example EX2_1 or EX2_3, the clock control circuit 220 can execute the normal-state restoration process.

When the FFs 210 in the data storage circuit 200' are the FFs 210a, the normal-state restoration process PRa (see FIG. 14), which has been described in example EX2_1, may be executed as the normal-state restoration process. When the FFs 210 in the data storage circuit 200' are the FFs 210b, the normal-state restoration process PRb (see FIG. 18), which has been described in example EX2_3, may be executed as the normal-state restoration process.

Since the same clock signals $CLK_M$ and $CLK_S$ generated in the clock control circuit 220 are supplied to the FFs 210 of the respective blocks, the normal-state restoration process PRa or PRb are executed in common for the blocks.

In a case where the FFs 210 in the data storage circuit 200' are the FFs 210a, when an error detection signal is outputted from the output data generation circuit 213a in either one of the blocks (either one of the FFs 210a), that is, when an error that any one of the data values of one set of the master output data $Q_M$ and two sets of the slave output data $Q_S$ is different from the other data values is detected, after a shift to the feedback state and a shift to the clock stop state, the clock control circuit 220 can execute the normal-state restoration process PRa. In the normal-state restoration process PRa, the clock control circuit 220 temporarily cancels the clock stop state so that data held in the three latch circuits (211a, 212a) is updated by use of the output data $Q_{OUT}$ (output data $Q_{OUT}$ expected to have a normal value) supplied by the selector 240 to the data input terminal $210_{IN}$. This update is executed in each of the blocks. Thereafter, the clock control circuit 220 restores the clock stop state of the clock signals $CLK_M$ and $CLK_S$.

In a case where the FFs 210 in the data storage circuit 200' are the FFs 210b, when an error detection signal is outputted from the output data generation circuit 213b in either one of the blocks (either one of the FFs 210b), that is, when an error that any one of the data values of two sets of the master output data $Q_M$ and one set of the slave output data $Q_S$ is different from the other data values is detected after a shift to the feedback state and a shift to the clock stop state, the clock control circuit 220 can execute the normal-state restoration process PRb. In the normal-state restoration process PRb, the clock control circuit 220 temporarily cancels the clock stop state so that data held in the three latch circuits (211b, 212b) is updated by use of the output data $Q_{OUT}$ (output data $Q_{OUT}$ expected to have a normal value) supplied by the selector 240 to the data input terminal $210_{IN}$. This update is executed in each of the blocks. Thereafter, the clock control circuit 220 restores the clock stop state of the clock signals $CLK_M$ and $CLK_S$.

Accordingly, a data value that has been inverted due to occurrence of an error can easily be restored to a normal value.

The data storage circuit 200' including the first and second blocks has been explained so far. However, the same applies to a data storage circuit including three or more blocks.

The configuration in which the selector 240 is included in each of the blocks has been explained. However, the selector 240 may be eliminated from each of the blocks. In this case, the value of the clock validity control signal $CLK_{CNT}$ is generally set to "1," and the value of the signal $CLK_{CNT}$ is switched from "1" to "0" after the writing operation in which the write target data $D_{WR}$ inputted as the data DD to the data input terminal $210_{IN}$ is taken by all of the three latch circuits is executed in all of the blocks. In the state where the write target data $D_{WR}$ is held in all of the three latch circuits, the clock control circuit 220 may first stop the master clock, and then, stop the slave clock.

EXAMPLE EX2_6

Example EX2_6 is explained. The technology of sharing one clock control circuit 220 among a plurality of the FFs 210 has been explained in example EX2_5. The clock control circuits 220 may be allocated to the FFs 210 in one-to-one basis. In this case, the clock control circuits 220 may be incorporated in the corresponding FFs 210. The same may apply to the clock validity control circuit 230.

EXAMPLE EX2_7

Example EX2_7 is explained. In order to reduce overhead caused by installation of the clock control circuit 220, it is desirable that one clock control circuit 220 is shared by a plurality of the FFs 210, similarly to example EX2_5. However, when this sharing is implemented, a wire for propagating the clock signals $CLK_M$ and $CLK_S$ is extended so that the skew (variation in the propagation delays) between the clock signals $CLK_M$ and $CLK_S$ is likely to become large. Due the influence of the skew, an overlap period of time in which the master latch circuit and the slave latch circuit are in the data transmission state at the same time in one of the FFs 210 may occur (see FIG. 9). According to the length of the overlap period of time, a malfunction may occur.

Therefore, in a case where one clock control circuit 220 is shared by a plurality of the FFs 210, similarly to example EX2_5, it is preferable to control the skew such that the master latch circuit and the slave latch circuit in each of the FFs 210 are prevented from being in the data transmission state at the same time, or to ensure a non-overlap period of time by adjusting the clock width, etc. A non-overlap period of time refers to a time period in which both the level of the master clock signal $CLK_M$ and the level of the slave clock signal $CLK_S$ are low, as illustrated in FIG. 10.

In order to ensure the non-overlap period of time, it is preferable that, during a state other than the clock stop state, the clock control circuit 220 adjust the sum of the duty of the master clock signal $CLK_M$ and the duty of the slave clock signal $CLK_S$ to be smaller than 100%, and then, match the center of a low level section of the master clock signal $CLK_M$ with the center of a high level section of the slave clock signal $CLK_S$ (see FIG. 10). Regarding any clock signal, the duty of the clock signal refers to the ratio of a high level section of the clock signal to the total section of the high level section and a low level section of the clock signal.

When a desirable non-overlap period of time is difficult to ensure, the method of example EX2_6 can be adopted.

EXAMPLE EX2_8

Example EX2_8 is explained.

When a plurality of slave latch circuits are provided as in example EX2_1, etc., three or more slave latch circuits may be included in one FF. That is, with use of an optional integer m of 2 or greater, a generalization that m slave latch circuits 212a are provided to the aforementioned FF 210a (see FIG. 12) such that the output data generation circuit 213a may generate the output data $Q_{OUT}$, by majority decision, based on one set of the master output data $Q_M$ from one master latch circuit 211a and m sets of the slave output data $Q_S$ from the m slave latch circuits 212a, can be made. In this case, when, among the one set of master output data $Q_M$ and the m sets of slave output data $Q_S$, at least "(1+m)/2" data sets have a value of "1," the value of the output data $Q_{OUT}$ is set to "1." Otherwise, the value of the output data $Q_{OUT}$ is set to "0." It is desirable that the integer m is an even number from the viewpoint of the majority decision rule.

When a plurality of master latch circuits are provided as in example EX2_3, etc., three or more master latch circuits may be included in one FF. That is, with use of an optional integer m of 2 or greater, a generalization that m master latch circuits 211b are provided to the aforementioned FF 210b (see FIG. 16) such that the output data generation circuit 213b may generate the output data $Q_{OUT}$, by majority decision, based on m sets of the master output data $Q_M$ from the m master latch circuits 211b and one set of the slave output data $Q_S$ from one slave latch circuits 212b, can be made. In this case, when, among the m sets of master output data $Q_M$ and the one set of slave output data $Q_S$, at least "(1+m)/2" data sets have a value of "1," the value of the output data $Q_{OUT}$ is also set to "1." Otherwise, the value of the output data $Q_{OUT}$ is set to "0." It is desirable that the integer m is an even number from the viewpoint of the majority decision rule.

Third Embodiment

A third embodiment of the present disclosure is explained. In the third embodiment, a use form, etc. of the data storage circuit described in the first or second embodiment is explained.

Figure 21:
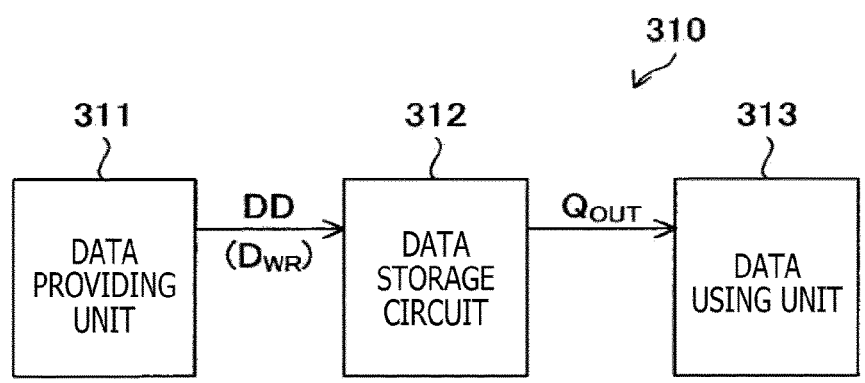
FIG. 21 is a configuration diagram of an electronic apparatus according to a third embodiment of the present disclosure.

FIG. 21 illustrates a configuration of an electronic apparatus 310 according to the third embodiment. The electronic apparatus 310 includes a data providing unit 311, a data storage circuit 312, and a data using unit 313. Any data storage circuits described in the first and second embodiments can be used as the data storage circuit 312. Thus, for example, the data storage circuit 312 may be any one of the aforementioned data storage circuits 100, 100', 200, and 200'. Examples of the electronic apparatus 310 include notebook type personal computers, information terminals, digital cameras, digital video cameras, mobile phones (including smartphones), mobile audio players, and sensor apparatuses.

The data providing unit 311 supplies data DD to the data storage circuit 312. In a case where the data storage circuit 312 includes a plurality of flip flop circuits such as a case where the data storage circuit 312 is the aforementioned data storage circuit 100' or 200', the data providing unit 311 supplies, to the data storage circuit 312, a plurality of sets of the data DD for the plurality of flip flop circuits. The data providing unit 311 can supply, as the data DD, the write target data $D_{WR}$ to the data storage circuit 312.

The output data $Q_{OUT}$ from the data storage circuit 312 is supplied to the data using unit 313. In a case where the data storage circuit 312 includes a plurality of flip flop circuits such as a case where the data storage circuit 312 is the aforementioned data storage circuit 100' or 200', the output data $Q_{OUT}$ from the plurality of flip flop circuits is supplied to the data using unit 313.

The data using unit 313 is any device configured to operate by using one set of the output data $Q_{OUT}$ or a plurality sets of the output data $Q_{OUT}$ supplied from the data storage circuit 312.

The electronic apparatus 310 has a no rewrite requiring section in which re-writing data stored in the data storage circuit 312 is not required, in addition to a write requiring section in which data writing to the data storage circuit 312 is required. During the no rewrite requiring section, the clock control circuit (120 or 220) in the data storage circuit 312 is in the clock stop state. Data writing to the data storage circuit 312 refers to data writing to a flip flop circuit provided in the data storage circuit 312. Re-writing data stored in the data storage circuit 312 refers to re-writing data stored in a flip flop circuit provided in the data storage circuit 312.

The third embodiment encompasses the following examples EX3_1 and EX3_2. Unless noted otherwise and unless inconsistent with the context, the matters aforementioned in the third embodiment are applied to the following examples EX3_1 and EX3_2. If any of the examples includes an inconsistency with the matters aforementioned in the third embodiment, a preference may be offered to the explanation of the examples. Further, a matter described in any one of the examples EX3_1 and EX3_2 may be applied to the other example, unless inconsistent with the context (that is, at least two of the examples can optionally be combined).

In the following explanation of the third embodiment, any data such as the write target data $D_{WR}$ or output data $Q_{OUT}$ may be interpreted as 1-bit data or data of multiple bits. When the write target data $D_{WR}$ or output data $Q_{OUT}$ is 1-bit data, the data storage circuit 312 is interpreted as a data storage circuit (e.g., the aforementioned data storage circuit 100 or 200) including only one flip flop circuit. When the write target data $D_{WR}$ or output data $Q_{OUT}$ is data of multiple bits, the data storage circuit 312 is interpreted as a data storage circuit (e.g., the aforementioned data storage circuit 100' or 200') including a plurality of flip flop circuits.

EXAMPLE EX3_1

Example EX3_1 is explained. In example EX3_1, the output data $Q_{OUT}$ from the data storage circuit 312 is used as configuration data of the data using unit 313. After start-up of the electronic apparatus 310, the configuration data of the data using unit 313 is not changed.

For example, in a case where the data using unit 313 is a power supply circuit configured to generate an output voltage having a desired voltage value from an input voltage, parameter data for giving the desired voltage value to the output voltage while addressing the variation of manufacturing is preliminarily set such that the parameter data is held as the write target data $D_{WR}$ in the data providing unit 311. Alternatively, for example, in a case where the data using unit 313 is an illuminance sensor for detecting illuminance, parameter data for adjusting the illuminance detection accuracy within the specification range while addressing the variation of manufacturing is preliminarily set such that the parameter data is held as the write target data $D_{WR}$ in the data providing unit 311. These types of parameter data may be referred to as trimming data. Further, for example, in a case where the data using unit 313 is a motor driver for performing driving control of a motor, appropriate parameter data needs to be set according to a motor in use.

The data providing unit 311 holds the parameter data in a non-volatile manner by using well-known method such as a non-volatile memory (e.g., one time programmable read only memory (OTPROM)), Zener-zap, a polysilicon fuse, or laser cutting. After start-up of the electronic apparatus 310, the data providing unit 311 supplies the parameter data as the write target data $D_{WR}$ to the data storage circuit 312 at a prescribed timing.

Once the data storage circuit 312 stores the write target data $D_{WR}$ (that is, holds the write target data $D_{WR}$ in the master latch circuit and the slave latch circuit), the data storage circuit 312 continues to hold the stored data so that the stored data is not re-written. That is, in example EX3_1, all the sections after the write requiring section during which the write target data $D_{WR}$ is stored in the data storage circuit 312 belong to no rewrite requiring sections. Therefore, in the example in FIG. 7, 13, or 17, all the sections after the timing $T_3$, $T_{A3}$, or $T_{B3}$ can be considered to belong to no rewrite requiring sections.

When the value of configuration data such as parameter data is inverted due to a soft error caused by radioactive rays or the like, the operation of the data using unit 313 becomes unfavorable. With use of the data storage circuit according to the first embodiment, a prescribed error handling process can be executed by detection of the soft error. With use of the data storage circuit according to the second embodiment, the soft error can be corrected.

EXAMPLE EX3_2

Figure 22:
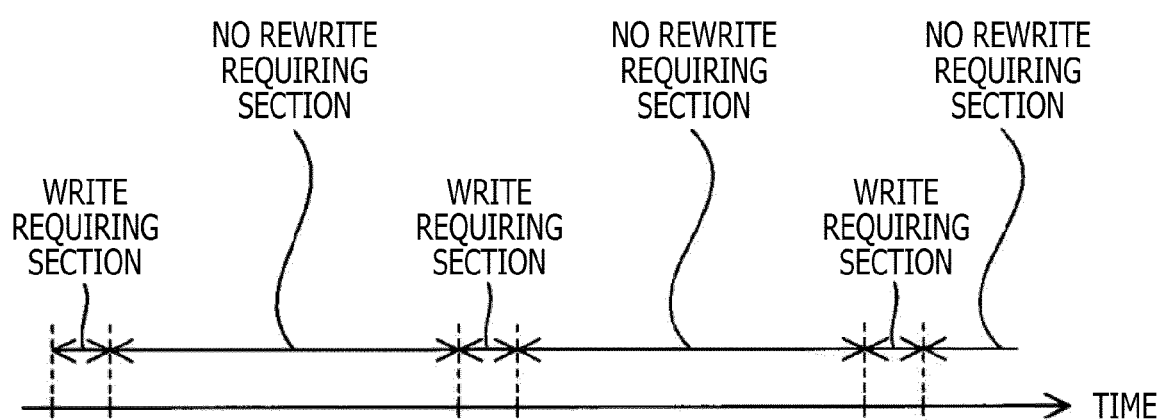
FIG. 22 is a diagram illustrating presence of a plurality of no rewrite requiring sections which are separated from one another according to example EX3_2 which belongs to the third embodiment of the present disclosure.

Example EX3_2 is explained. In example EX3_2, it is assumed that a plurality of no rewrite requiring sections that are separated from one another are generated after start-up of the electronic apparatus 310, as illustrated in FIG. 22.

Write requiring sections are provided prior to the first no rewrite requiring section and between two adjacent no rewrite requiring sections.

In each of the write requiring sections, the clock validity control circuit (130, 230) of the data storage circuit 312 sets the value of the clock validity control signal $CNT_{CLK}$ to "1," while the data providing unit 311 gives, as the data DD, the write target data $D_{WR}$ to the data storage circuit 312. Also, in a case where the aforementioned selector (140, 240) is provided to the data storage circuit 312, the value of the writing control signal $CNT_{WR}$ is set to "1" in each section (write requiring section) during which the write target data $D_{WR}$ is to be given to the data storage circuit 312. Accordingly, in each of the write requiring sections, the write target data $D_{WR}$ is written (that is, taken and held) into the FF (110, 210) of the data storage circuit 312. In the case where the aforementioned selector (140, 240) is provided to the data storage circuit 312, the write target data $D_{WR}$ is written into the FF (110, 210) of the data storage circuit 312, and then, the value of the writing control signal $CNT_{WR}$ is set to "0" so that a shift to the feedback state is made.

When the write target data $D_{WR}$ is written into the FF of the data storage circuit 312 in one certain write requiring section, a shift to a no rewrite requiring section is made. Writing the write target data $D_{WR}$ into the FF of the data storage circuit 312 is implemented by the operation from the timing $T_1$ to $T_3$ in FIG. 7, the operation from the timing $T_{A1}$ to $T_{A3}$ in FIG. 13, or the operation from the timing $T_{B1}$ to $T_{B3}$ in FIG. 17, for example.

In each no rewrite requiring section, the clock validity control circuit (130, 230) of the data storage circuit 312 sets the value of the clock validity control signal $CNT_{CLK}$ to "0," the clock control circuit (120, 220) of the data storage circuit 312 sets the state of each of the clock signals $CLK_M$ and $CLK_S$ to the clock stop state. It is to be noted that, in a case where the aforementioned selector (140, 240) is provided to the data storage circuit 312, the feedback state is necessarily established in each no rewrite requiring section.

Accordingly, in a case where the data storage circuit 100 or 100' according to the first embodiment is used as the data storage circuit 312, whether or not a soft error has occurred in the FF 110 of the data storage circuit 312 can be detected in each no rewrite requiring section. In a case where the data storage circuit 200 or 200' according to the second embodiment is used as the data storage circuit 312, even if a soft error has occurred in the FF 210 of the data storage circuit 312, the output data $Q_{OUT}$ in which the soft error has been corrected can be outputted to the data using unit 313 in each no rewrite requiring section.

The aforementioned method explained in example EX3_2 is suitable for a case where data re-writing is not frequently required. On the assumption that the electronic apparatus 310 is provided with n groups each consisting of the data providing unit 311, the data storage circuit 312, and the data using unit 313 (n is an optional integer of 2 or greater), an example of the use form is explained.

For example, in each of the groups, the FF (110, 210) of the data storage circuit 312 is a state machine, the data providing unit 311 is a state control unit that writes a value into the state machine, and the data using unit 313 is a processing unit that performs a process according to the value of the state machine.

The first to n-th groups do not simultaneously operate. At one certain timing, only one of the first to n-th groups is operating. It is assumed that a first section during which only the first group is operating, a second section during which only the second group is operating, . . . , and an n-th section during which only the n-th group is operating are repeated in this order. In this case, for the first group, only the first section is a write requiring section while the second to n-th sections are no rewrite requiring sections. For the second group, only the second section is a write requiring section while the first and the third to n-th sections are no rewrite requiring sections. The same applies to the other groups. For such a case that does not require frequent data re-writing (in other words, a case where a plurality of write requiring sections separately come), the method described in example EX3_2 is useful.

It is to be noted that each of the any data storage circuits (100, 100', 200, 200', 312) described in the first to third embodiments may be formed as a semiconductor integrated circuit. A semiconductor apparatus provided with the semiconductor integrated circuit including a data storage circuit and with a casing accommodating the semiconductor integrated circuit can be configured.

Various modifications of the embodiments of the present disclosure can be made, as appropriate, within the range of the technical concept set forth in the claims. The aforementioned embodiments are merely some examples of the embodiments of the present disclosure. The present disclosure and the meanings of the terms of the constituent components thereof are not limited to those described in the aforementioned embodiments. The specific numerical values given in the above explanation are mere exemplifications. It is needless to say that these values can be changed to various numerical values.

IN THE DRAWINGS

Figure 9:
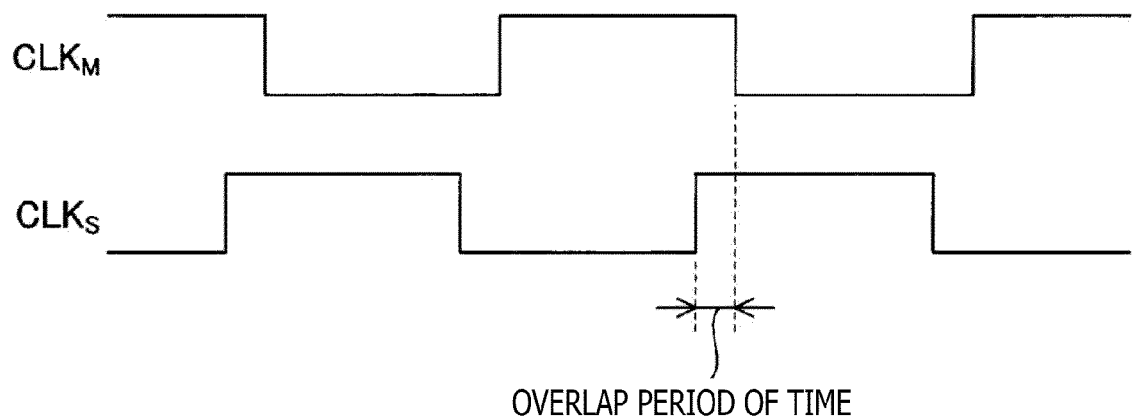
FIG. 9 is a diagram for explaining an overlap period of time.
Figure 15:
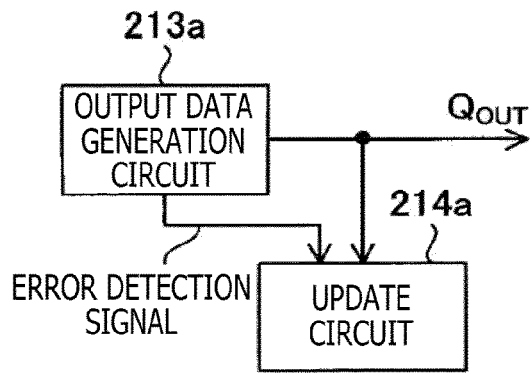
FIG. 15 is a partial configuration diagram of a data storage circuit according to example EX2_2 which belongs to the second embodiment of the present disclosure.
Figure 19:
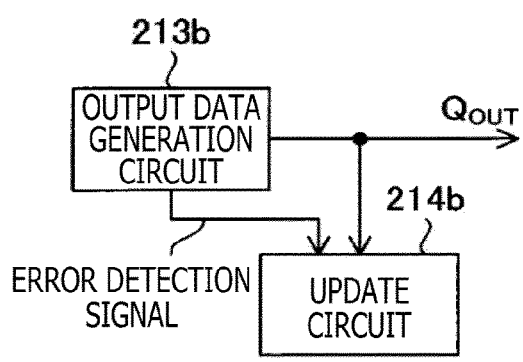
FIG. 19 is a partial configuration diagram of a data storage circuit according to example EX2_4 which belongs to the second embodiment of the present disclosure.

FIG. 1
111 MASTER LATCH CIRCUIT
112 SLAVE LATCH CIRCUIT
113 ERROR DETECTION CIRCUIT
120 CLOCK CONTROL CIRCUIT
130 CLOCK VALIDITY CONTROL CIRCUIT
($D_{WR}$ OR INDEFINITE DATA)
FIG. 2
WHEN $CLK_{CNT}$='1'
FIGS. 4A and 4B
DATA TRANSMISSION STATE OF MASTER LATCH CIRCUIT
DATA HOLDING STATE OF MASTER LATCH CIRCUIT
FIGS. 6A and 6B
DATA TRANSMISSION STATE OF SLAVE LATCH CIRCUIT
DATA HOLDING STATE OF SLAVE LATCH CIRCUIT
FIG. 7
TIME
MASTER CLOCK IS STOPPED
SLAVE CLOCK IS STOPPED
FEEDBACK STATE
FIG. 8
120 CLOCK CONTROL CIRCUIT
130 CLOCK VALIDITY CONTROL CIRCUIT
FIG. 9
OVERLAP PERIOD OF TIME
FIG. 10
NON-OVERLAP PERIOD OF TIME
FIG. 11
220 CLOCK CONTROL CIRCUIT
230 CLOCK VALIDITY CONTROL CIRCUIT
($D_{WR}$ OR INDEFINITE DATA)
FIG. 12
211a MASTER LATCH CIRCUIT
212a SLAVE LATCH CIRCUIT
213a OUTPUT DATA GENERATION CIRCUIT
FIG. 13
TIME
MASTER CLOCK IS STOPPED
SLAVE CLOCK IS STOPPED
TWO $Q_S$S
FEEDBACK STATE
FIG. 14
TIME
NORMAL VALUE
TWO $Q_S$S
CLOCK STOP STATE
NORMAL-STATE RESTORATION PROCESS PRa
FEEDBACK STATE
FIG. 15
213a OUTPUT DATA GENERATION CIRCUIT
214a UPDATE CIRCUIT
ERROR DETECTION SIGNAL
FIG. 16
211b MASTER LATCH CIRCUIT
212b SLAVE LATCH CIRCUIT
213b OUTPUT DATA GENERATION CIRCUIT
FIG. 17
TIME
MASTER CLOCK IS STOPPED
TWO $Q_M$S
SLAVE CLOCK IS STOPPED
FEEDBACK STATE
FIG. 18
TIME
NORMAL VALUE
TWO $Q_M$S
CLOCK STOP STATE
NORMAL-STATE RESTORATION PROCESS PRb
FEEDBACK STATE
FIG. 19
213b OUTPUT DATA GENERATION CIRCUIT
214b UPDATE CIRCUIT
ERROR DETECTION SIGNAL
FIG. 20
220 CLOCK CONTROL CIRCUIT
230 CLOCK VALIDITY CONTROL CIRCUIT
FIG. 21
311 DATA PROVIDING UNIT
322 DATA STORAGE CIRCUIT
313 DATA USING UNIT
FIG. 22
WRITE REQUIRING SECTION
NO REWRITE REQUIRING SECTION
TIME

What is claimed is:

1. A data storage circuit that stores target input data inputted to a data input terminal and outputs the stored data as target output data through a data output terminal, the data storage circuit comprising:
a clock control circuit that outputs a master clock signal and a slave clock signal based on a reference clock signal;
a master latch circuit that takes the target input data based on the master clock signal, holds the taken data, and outputs the taken data as master output data;
a slave latch circuit that takes the master output data based on the slave clock signal, holds the taken data, and outputs the taken data as slave output data; and
an output data generation circuit that generates the target output data, wherein a plurality of the slave latch circuits are provided, after write target data inputted as the target input data to the data input terminal is taken by the master latch circuit and the plurality of slave latch circuits, the clock control circuit is shifted to a clock stop state of fixing a signal level of the master clock signal and a signal level of the slave clock signal such that all of the master latch circuit and the plurality of slave latch circuits are in a data holding state, and, during the clock stop state, the output data generation circuit generates the target output data, by majority decision, based on the master output data from the master latch circuit and a plurality of sets of slave output data from the plurality of slave latch circuits.

2. The data storage circuit according to claim 1, further comprising:

a selector that selectively supplies, according to an inputted writing control signal, either the write target data or the target output data as the target input data to the data input terminal.

3. The data storage circuit according to claim 2, wherein, after the write target data is supplied to the data input terminal by the selector and the write target data is taken by the master latch circuit and the plurality of slave latch circuits, the selector is shifted to a feedback state of supplying the target output data to the data input terminal, and the clock control circuit is shifted to the clock stop state.

4. The data storage circuit according to claim 3, wherein, when an error that any one of data values of the master output data and the sets of slave output data is different from other data values is detected after a shift to the feedback state and a shift to the clock stop state, the clock control circuit temporarily cancels the clock stop state so that data held in the master latch circuit and data held in the plurality of slave latch circuits are updated by use of the target output data supplied by the selector to the data input terminal, and then, the clock control circuit restores the clock stop state.

5. The data storage circuit according to claim 4, wherein a plurality of blocks each including the master latch circuit, the plurality of slave latch circuits, the output data generation circuit, and the selector are provided, and one clock control circuit is shared by the plurality of blocks, and, when the error is detected in any one of the blocks after a shift to the feedback state and a shift to the clock stop state, the clock control circuit temporarily cancels the clock stop state so that, in each of the blocks, data held in the master latch circuit and data held in the plurality of slave latch circuits are updated by use of the target output data supplied by the selector to the data input terminal, and then, the clock control circuit restores the clock stop state.

6. The data storage circuit according to claim 1, wherein a plurality of blocks each including the master latch circuit, the plurality of slave latch circuits, and the output data generation circuit are provided, and one clock control circuit is shared by the plurality of blocks.

7. The data storage circuit according to claim 1, further comprising:

an update circuit that, when an error that any one of data values of the master output data and the sets of slave output data is different from other data values is detected, updates data held in the master latch circuit and data held in the plurality of slave latch circuits by use of the target output data generated by majority decision.

8. A data storage circuit that stores target input data inputted to a data input terminal and outputs the stored data as target output data through a data output terminal, the data storage circuit comprising:

a clock control circuit that outputs a master clock signal and a slave clock signal based on a reference clock signal;

a master latch circuit that takes the target input data based on the master clock signal, holds the taken data, and outputs the taken data as master output data;

a slave latch circuit that takes the master output data based on the slave clock signal, holds the taken data, and outputs the taken data as slave output data; and an output data generation circuit that generates the target output data, wherein a plurality of the master latch circuits are provided, and the master output data from one of the plurality of master latch circuits is supplied to the slave latch circuit, after write target data inputted as the target input data to the data input terminal is taken by the plurality of master latch circuits and the slave latch circuit, the clock control circuit is shifted to a clock stop state of fixing a signal level of the master clock signal and a signal level of the slave clock signal such that all of the plurality of master latch circuits and the slave latch circuit are in a data holding state, and, during the clock stop state, the output data generation circuit generates the target output data, by majority decision, based on a plurality of sets of the master output data from the master latch circuits and the slave output data from the slave latch circuit.

9. The data storage circuit according to claim 8, further comprising:

a selector that selectively supplies, according to an inputted writing control signal, either the write target data or the target output data as the target input data to the data input terminal.

10. The data storage circuit according to claim 9, wherein, after the write target data is supplied by the selector to the data input terminal and the write target data is taken by the plurality of master latch circuits and the slave latch circuit, the selector is shifted to a feedback state of supplying the target output data to the data input terminal, and the clock control circuit is shifted to the clock stop state.

11. The data storage circuit according to claim 10, wherein, when an error that any one of data values of the sets of master output data and the slave output data is different from other data values is detected after a shift to the feedback state and a shift to the clock stop state, the clock control circuit temporarily cancels the clock stop state so that data held in the plurality of master latch circuits and data held in the slave latch circuit are updated by use of the target output data supplied by the selector to the data input terminal, and then, the clock control circuit restores the clock stop state.

12. The data storage circuit according to claim 11, wherein a plurality of bocks each including the plurality of master latch circuits, the slave latch circuit, the output data generation circuit, and the selector are provided, and one clock control circuit is shared by the plurality of blocks, and, when the error is detected in any one of the blocks after a shift to the feedback state and a shift to the clock stop state, the clock control circuit temporarily cancels the clock stop state so that, in each of the blocks, data held in the plurality of master latch circuits and data held in the slave latch circuit are updated by use of the target output data supplied by the selector to the data input terminal, and then, the clock control circuit restores the clock stop state.

13. The data storage circuit according to claim 8, wherein a plurality of bocks each including the plurality of master latch circuits, the slave latch circuit, and the output data generation circuit are provided, and one clock control circuit is shared by the plurality of blocks.

14. The data storage circuit according to claim 8, further comprising:

an update circuit that, when an error that any one of data values of the sets of master output data and the slave output data is different from other data values, updates data held in the plurality of master latch circuits and data held in the slave latch circuit by use of the target output data generated by majority decision.

15. A data storage circuit that stores target input data inputted to a data input terminal and outputs the stored data as target output data through a data output terminal, the data storage circuit comprising:

a clock control circuit that outputs a master clock signal and a slave clock signal based on a reference clock signal;

a master latch circuit that takes the target input data based on the master clock signal, holds the taken data, and outputs the taken data as master output data;

a slave latch circuit that takes the master output data based on the slave clock signal, holds the taken data, and outputs the taken data as slave output data; and an error detection circuit, wherein the slave output data is outputted as the target output data from the data output terminal, after write target data inputted as the target input data to the data input terminal is taken by the master latch circuit and the slave latch circuit, the clock control circuit is shifted to a clock stop state of fixing a signal level of the master clock signal and a signal level of the slave clock signal such that both the master latch circuit and the slave latch circuit are in a data holding state, during the clock stop state, the error detection circuit outputs a prescribed error detection signal when a value of the master output data is not identical to a value of the slave output data, and the data storage circuit further includes a selector, and the selector selectively supplies, according to an inputted writing control signal, either the write target data or the target output data as the target input data to the data input terminal.

16. The data storage circuit according to claim 15, wherein, after the write target data is supplied by the selector to the data input terminal and the write target data is taken by the master latch circuit and the slave latch circuit, the selector is shifted to a feedback state of supplying the target output data to the data input terminal, and the clock control circuit is shifted to the clock stop state.

17. The data storage circuit according to claim 15, wherein a plurality of blocks each including the master latch circuit, the slave latch circuit, the error detection circuit, and the selector are provided, and one clock control circuit is shared by the plurality of blocks.

* * * * *